US012663850B2

(12) United States Patent　　　　　(10) Patent No.:　US 12,663,850 B2
Suresh et al.　　　　　　　　　　　　(45) Date of Patent:　Jun. 23, 2026

(54) AUTOMATIC ON-DIE FREQUENCY TUNING USING TUNABLE REPLICA CIRCUITS

(71) Applicant: Intel Corporation, Santa Clara, CA (US)

(72) Inventors: Vikram B. Suresh, Portland, OR (US); Sanu K. Mathew, Portland, OR (US); Christopher Schaef, Hillsboro, OR (US); Chandra S. Katta, Cupertino, CA (US); Long Sheng, Shanghai (CN); Chin S. Park, Palo Alto, CA (US); Srinivasan Rajagopalan, Palo Alto, CA (US); Raju Rakha, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 265 days.

(21) Appl. No.: 17/832,423

(22) Filed: Jun. 3, 2022

(65) Prior Publication Data

US 2023/0195200 A1　　Jun. 22, 2023

Related U.S. Application Data

(60) Provisional application No. 63/293,000, filed on Dec. 22, 2021, provisional application No. 63/293,026, (Continued)

(51) Int. Cl.
| | |
|---|---|
| *G06F 1/00* | (2006.01) |
| *G06F 1/324* | (2019.01) |
| *H03K 5/01* | (2006.01) |
| *H03L 7/08* | (2006.01) |
| *H03K 5/00* | (2006.01) |

(52) U.S. Cl.
CPC ............... *G06F 1/324* (2013.01); *H03K 5/01* (2013.01); *H03L 7/08* (2013.01); *H03K 2005/00019* (2013.01)

(58) Field of Classification Search
CPC .. G06F 1/324; G06F 1/10; H03K 5/01; H03K 2005/00019; H03L 7/08; H03L 7/1976
See application file for complete search history.

(56) References Cited

U.S. PATENT DOCUMENTS

| | | | | |
|---|---|---|---|---|
| 6,201,448 | B1* | 3/2001 | Tam .......................... | H03L 7/06 |
| | | | | 331/25 |
| 9,628,089 | B1* | 4/2017 | Jain ........................ | H03K 5/135 |

(Continued)

*Primary Examiner* — Xuxing Chen
(74) *Attorney, Agent, or Firm* — NICHOLSON DE VOS WEBSTER & ELLIOTT LLP

(57)　　　　　ABSTRACT

Embodiments herein relate to optimizing the operation of multiple integrated circuits (ICs) operating in parallel. In one aspect, the ICs are arranged in a voltage-stacked configuration, and an operating frequency of each IC is controlled using a tunable replica circuit to stabilize its voltage drop. The tunable replica circuit mimics a critical path on the IC. In another aspect, an IC is divided into top and bottom portions which are in respective voltage domains on a substrate. The substrate include a deep n-well region for the higher voltage domain. In another aspect, a physically unclonable function (PUF) is used to generate identifiers for each IC among a multiple ICs on a board. Entropy sources of the PUF generate bits of the identifiers. Unstable entropy sources are identified and their bits are masked out.

13 Claims, 14 Drawing Sheets

Related U.S. Application Data filed on Dec. 22, 2021, provisional application No. 63/293,031, filed on Dec. 22, 2021.

(56) References Cited

U.S. PATENT DOCUMENTS

| | | | |
|---|---|---|---|
| 10,009,016 B1 * | 6/2018 | Ho | G06F 1/305 |
| 10,175,734 B1 * | 1/2019 | Bourgeault | G06F 1/26 |
| 11,950,358 B1 * | 4/2024 | Lambrecht | G06F 1/26 |
| 12,237,832 B2 * | 2/2025 | Bautista Gabriel | |
| | | | H03K 19/01855 |
| 2005/0047040 A1 * | 3/2005 | Naffziger | H03K 5/08 |
| | | | 361/90 |
| 2015/0348647 A1 * | 12/2015 | Veches | G11C 29/12005 |
| | | | 714/42 |
| 2016/0072491 A1 * | 3/2016 | Bowman | H03K 5/134 |
| | | | 327/276 |
| 2016/0330031 A1 * | 11/2016 | Drego | H04L 9/3239 |
| 2019/0393204 A1 * | 12/2019 | Delacruz | H01L 25/50 |
| 2020/0028514 A1 * | 1/2020 | Hanke | G06F 1/10 |
| 2021/0359675 A1 * | 11/2021 | Hossain | H03K 17/161 |
| 2021/0399722 A1 * | 12/2021 | Hamdan | H03L 7/081 |
| 2022/0101888 A1 * | 3/2022 | Kim | H01L 25/0652 |

* cited by examiner

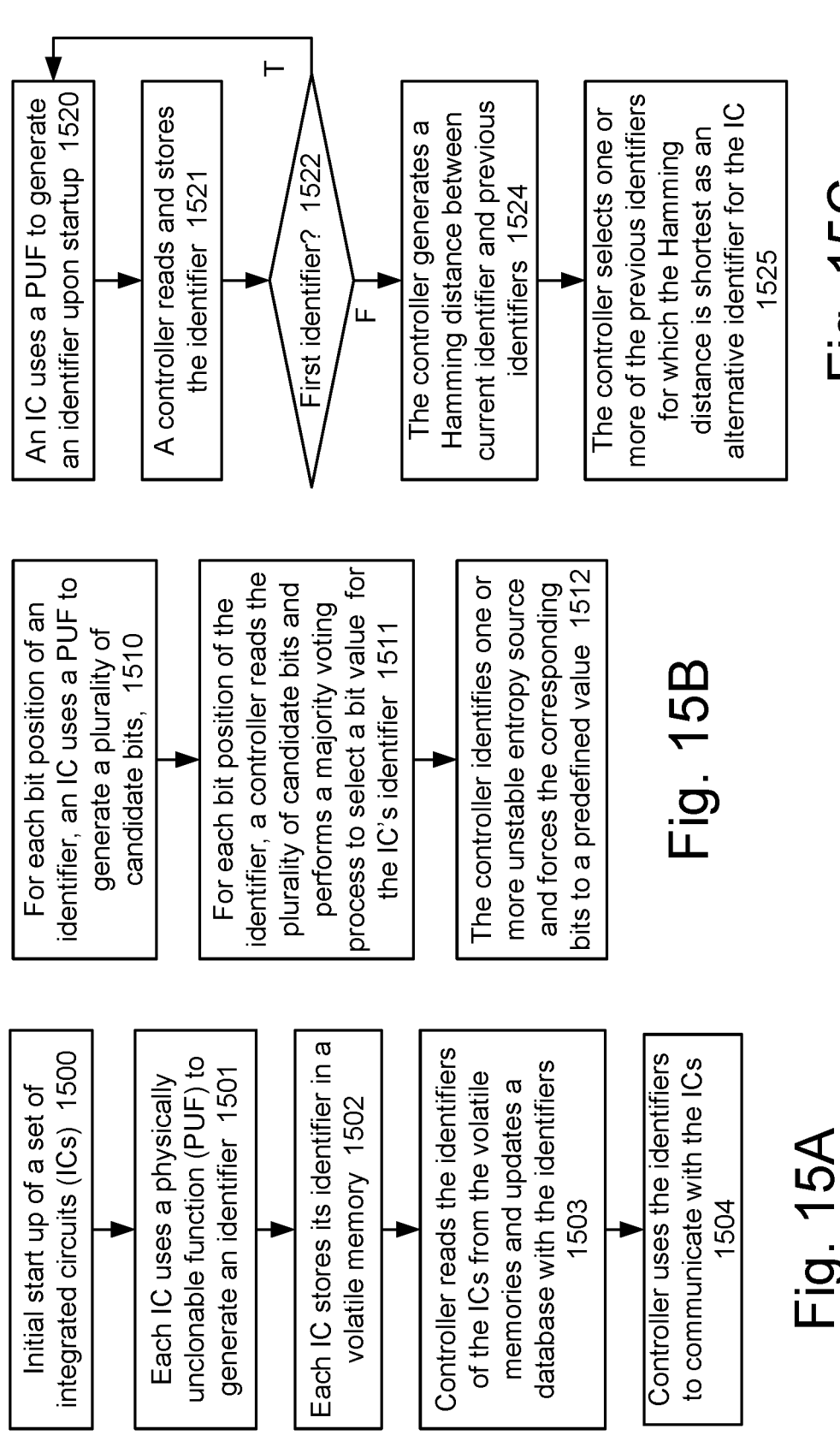

An IC uses a PUF to generate an identifier upon startup 1520

A controller reads and stores the identifier 1521

First identifier? 1522

The controller generates a Hamming distance between current identifier and previous identifiers 1524

The controller selects one or more of the previous identifiers for which the Hamming distance is shortest as an alternative identifier for the IC 1525

Fig. 15C

For each bit position of an identifier, an IC uses a PUF to generate a plurality of candidate bits, 1510

For each bit position of the identifier, a controller reads the plurality of candidate bits and performs a majority voting process to select a bit value for the IC's identifier 1511

The controller identifies one or more unstable entropy source and forces the corresponding bits to a predefined value 1512

Fig. 15B

Initial start up of a set of integrated circuits (ICs) 1500

Each IC uses a physically unclonable function (PUF) to generate an identifier 1501

Each IC stores its identifier in a volatile memory 1502

Controller reads the identifiers of the ICs from the volatile memories and updates a database with the identifiers 1503

Controller uses the identifiers to communicate with the ICs 1504

Fig. 15A

AUTOMATIC ON-DIE FREQUENCY TUNING USING TUNABLE REPLICA CIRCUITS

PRIORITY CLAIM

This application claims the benefit of U.S. provisional patent applications 63/293,031, 63/293,026, 63/293,000, each of which was filed Dec. 22, 2021, and each of which is incorporated herein by reference.

FIELD

The present application generally relates to the field of computing devices having multiple integrated circuits operating in parallel, and more particularly to optimizing the operation of the integrated circuits.

BACKGROUND

Computing devices can employ multiple integrated circuits operating in parallel to solve computationally-intensive problems. For example, in the field of cryptocurrency mining, large numbers of application-specific integrated circuits (ASICs), General-Purpose Graphics Processing Unit (GPGPU) ICs or Field-Programmable Gate Array (FPGA) ICs can be configured on one or more printed circuit boards (PCBs), also referred to as hash boards. However, various challenges are presented in operating such computing devices, including minimizing power consumption.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 15A depicts a flowchart of an example process for generating an identifier for an IC, in accordance with various embodiments.

FIG. 15B depicts a flowchart of an example process for generating an identifier for an IC using a majority voting process and dark bit masking, in accordance with various embodiments.

FIG. 15C depicts a flowchart of an example process for generating an identifier for an IC using a minimum Hamming distance, in accordance with various embodiments.

DETAILED DESCRIPTION

Figure 1:
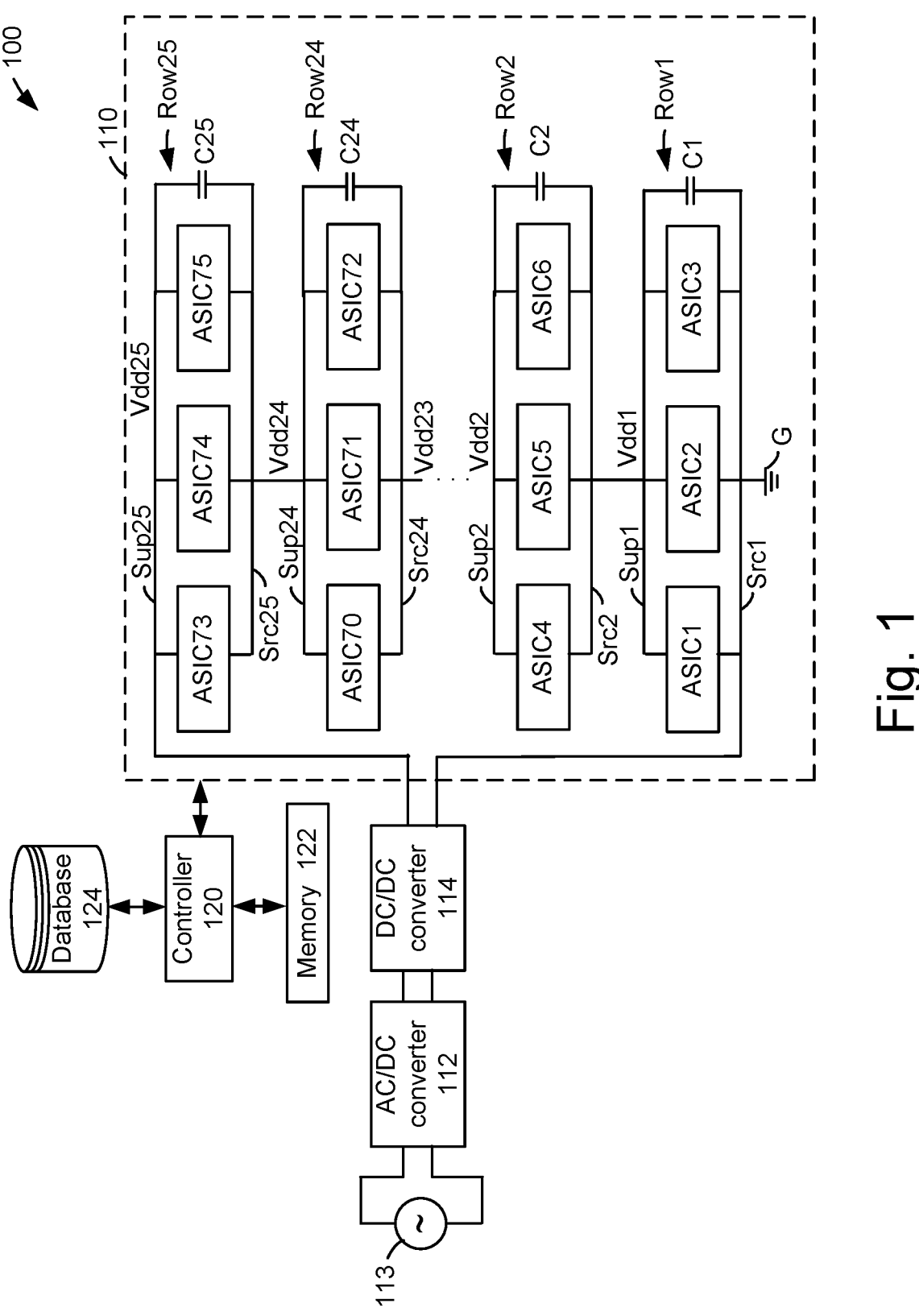
FIG. 1 depicts an example implementation of a computing device 100 having multiple rows of integrated circuits (ICs) in a voltage-stacked configuration, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or link, and/or the like.

As mentioned at the outset, various challenges are presented in operating computing devices which employ multiple integrated circuits operating in parallel. For example, minimizing power consumption is a constant challenge. As an example, cryptocurrency mining systems employ a large number of mining ICs, all working in parallel on Proof-of-work (POW) algorithms. The large current requirement for these ICs results in power delivery efficiency losses at the system and IC level, directly impacting the efficiency and profitability of mining operations.

In one solution to minimize these power delivery losses, the ICs and/or the mining engines within each IC, can be voltage stacked. In a voltage stacked configuration, different circuits are arranged serially where the source voltage of one circuit is the supply voltage of a next circuit. To maintain a balanced stack voltage and ensure reliable performance, the current drawn by each IC in the stack can be controlled using the operating frequency. However, stacked voltage systems and ICs depend on the system software to program on-die phase-locked loops (PLLs) to control the current drawn and hence the stack voltage. This is problematic because it results in a considerable load on the software. The load is great due to the need for the system software to constantly monitor the voltage across each IC stack and ensure in-time PLL tuning results. The system software is the software used to control the various ICs on the computing device, and may be run on a controller. This is not a scalable solution to manage hundreds or thousands of ICs in larger mining systems or server class mining racks.

The techniques disclosed herein address the above and other issues. In one aspect, an automatic on-die frequency tuning technique and circuitry are provided for each IC. In one approach, a Tunable Replica Circuit (TRC) on the IC identifies voltage fluctuations in the IC based on a variation in a time needed to perform a task. The task can represent a subset of the tasks performed by processing engines of the IC. A PLL on the die is controlled based on the time variations to maintain stability and reliability of the voltage stack. This TRC-based frequency tuning does not depend on the system software to constantly monitor the ICs, thus significantly reducing the load on the system software. It also eliminates the need for constant reporting of voltage sensor values to the system controller, thereby reducing the platform bus traffic. Moreover, on-die circuits to tune the PLL frequency can provide a significantly faster response to voltage fluctuations, ensuring quick re-stabilization of the stack voltage and protection for ICs against unsafe voltages. Optionally, the system software has the capability to override the TRC in controlling the PLLs when the TRCs are not able to keep the voltage drop within a desired range.

In another aspect, a method and apparatus are provided for balancing on-die voltage stacks using a deep n-well substrate configuration. In this approach, different portions of an IC, such as top and bottom stacks of processing engines of an IC, can be arranged in a voltage-stacked configuration. This approach can use a deep n-well in the substrate of the IC to create split voltage domains on the die. The use of a deep n-well in a digital design reduces noise coupling between digital regions on separate voltage domains formed with on-die voltage stacking. On-die voltage stacking provides a highly efficient power delivery network, by allowing use of a higher input voltage that can be split internally on the die into multiple voltage domains. Specifically, the internal distribution of voltage domains on the die are implemented on a p-substrate and a deep n-well substrate. Half of the stack is implemented using the deep n-well layer to reduce substrate noise caused by minority carrier injection and capacitive coupling of noise on the supply rail. This approach avoids the overhead costs of implementing isolation cells across the voltage stacks. In particular, without a deep n-well, a voltage stacking implementation would require the overhead costs of guardrails and isolation cells between the two voltage stacks to avoid noise and cross-coupling effects, increasing die area and cost. A higher IR drop would also be incurred, causing a wider impact on performance at near-threshold voltage operations.

In another aspect, on-die device identifier (ID) generation is provided using Physically Unclonable Functions (PUFs). Identifying the ICs in a computing device is important to allow communications between a system controller and the ICs. However, techniques such as using fuses on the die or on a hash board are costly in terms of silicon area, and inflexible as the identifier is static. Also, the fuses require additional programming steps during post-silicon testing. Generally, having static fuses on the hash board to externally program device IDs increases bill of materials (BOM) cost and platform design time.

Moreover, this problem becomes magnified in many applications. For example, cryptocurrency mining systems employ a large number of mining ICs, all working in parallel on PoW algorithms. The number of ICs could range from around hundreds in a self-contained system to thousands in server-class rack designs for mining farms. Since the ICs work on parallel independent PoW inputs, the system software needs to keep track of workload deployment, performance, supply voltage and accuracy of results for all ICs in the system. This requires the controller to communicate with the ICs using their identifiers.

Instead, an on-die device ID generation technique is provided using PUFs to facilitate efficient identification of the ICs by the system software. The PUF circuits harness manufacturing process variations to generate a unique device ID for each IC. The PUF circuits can include entropy sources which each generate a bit for an identifier. For example, 64 entropy sources may be used to generate the bits of a 64-bit identifier. The PUF circuits are more area-efficient than one-time programmable fuses and do not require any additional programming steps during post-silicon tests. Further, the PUFs provide the flexibility of scaling the ID for larger systems seamlessly without requiring any additional post-silicon configuration.

In one approach, each IC generates its ID upon start up and stores it in a local volatile memory of the IC. A system controller can then read the ID and store it in a database for future reference in communicating with the IC. In one implementation, the IC generates multiple candidate bits for each bit position of the ID and the controller performs a majority vote to select one of the candidates as a bit which will be used to identify the IC. The controller can also detect faulty bits among the different candidate bits and force these bits to a predefined value, in a dark masking process. The faulty bits are mismatched bits which are generated by unstable entropy sources.

In another implementation, the IC generates similar identifiers over time, each time the IC starts up, and the controller stores the identifiers. The identifiers are not substantially different from the ones store in a database since the ID differences arise due to noise. So, the IC will generate a number of identifiers which are close to the actual ID. The controller computes a Hamming distance between a current identifier and one or more previously-generated identifiers and picks the one that is the closest. One or more previously-generated identifier with the smallest Hamming distance are selected as alternative identifiers for the IC.

These and other features will be apparent in view of the following discussion.

FIG. 1 depicts an example implementation of a computing device 100 having multiple rows of integrated circuits (ICs) in a voltage-stacked configuration, in accordance with various embodiments. Each IC may be formed on a respective die or chip. The rows include Row1-Row25, where each row includes three ICs as an example. Other arrangements are possible as well. Each row can include one or more ICs. In a voltage-stacked configuration, the supply voltage of one row is the source voltage of an adjacent row. The supply voltage is the higher potential at one side of a row or IC, e.g., at a supply voltage node, and the source voltage is the lower potential at the other side of the row or IC, e.g., at a source voltage node. The source voltage is typically positive except for the last row for which the source voltage may be at ground or Vss=0 V. The voltage drop across each row may be approximately equal. Thus, the voltage drop of each row is equal to the bias across the set of rows divided by the number of rows.

For example, the topmost row, Row25, has a supply voltage node Sup25 at a voltage Vdd25 and a source voltage node Src25 at a voltage Vdd24. The next row, Row24, has a supply voltage node Sup24 at a voltage Vdd24 and a source voltage node Src24 at a voltage Vdd23. The next to last row, Row2, has a supply voltage node Sup2 at a voltage Vdd2 and a source voltage node Src2 at a voltage Vdd1. The bottom row, Row1, has a supply voltage node Sup1 at a voltage Vdd1 and a source voltage node Src1 at a ground (G) voltage.

The ICs in this example are ASICs and include ASIC1-ASIC3 in Row 1, ASIC4-ASIC6 in Row2, . . . , ASIC70-ASIC72 in Row 24 and ASIC73-ASIC75 in Row 25, for a total of 75 ASICs on a board 110 such as a PCB. Additionally, a capacitor is connected in parallel across the ASICs in each row to minimize sudden changes in the voltage drop across the row. For example, capacitors C1, C2, . . . , C24 and C25 are connected in Row1, Row2, . . . , Row24 and Row25, respectively.

An alternating current (AC) source 113 provides AC current to an AC/DC converter 112 which in turn provides DC current to a DC/DC converter 114. The AC source 113 may be a common AC mains power supply, e.g., at 120 V with a frequency of 60 Hz or at 230 V with a frequency of 50 Hz. The DC/DC converter may be a step down converter which reduces the input voltage to a voltage, e.g., 7.1-7.4 V, which is suitable for use by the set of ASICs or other ICs.

The board also communicates with a controller 120 which is turn is coupled to a database 124 and a memory 122. The memory 122 may store instructions which can be executed by the controller to achieve the functionality described herein. The memory may be non-volatile. The database may be updated by the controller based on information obtained from the ICs on the board. This information can include identifiers of the ICs and voltage drop information of the ICs.

The ASICs are arranged laterally of one another across the board 110 in a two-dimensional configuration. It is also possible for the ASICs to be stacked one upon the other.

As mentioned, this example includes ASICs as a type of IC. Other types of ICs can be used, including a General-Purpose Graphics Processing Unit (GPGPU) IC and a Field Programmable Gate Array (FPGA) IC. A GPGPU is a graphics processing unit that is programmed for purposes beyond graphics processing, such as performing computations typically conducted by a Central Processing Unit (CPU). A GPGPU typically includes a predetermined set of tools while a FPGA can have customized software. Moreover, an ASIC is typically designed to run a specific algorithm while a GPGPU IC and a FPGA IC can have their algorithms changed.

Different types of ICs are appropriate for different computational tasks. For example, in the field of cryptocurrency mining, the hashing speed and power consumption of the GPGPU IC and the FPGA IC are similar but less than that of an ASIC. Various types of cryptocurrency can be mined using different ICs. For example, ASICs are best for mining Bitcoin, Litecoin, Dash, and coins that are based off these algorithms. GPGPUs are best for mining Ethereum, Monero, Ravencoin, and coins based off those algorithms. Bitcoin is one of the early forms of cryptocurrency and uses the SHA-256 cryptographic hash function. Litecoin differs from Bitcoin in aspects such as a faster block generation rate and use of Scrypt as a PoW algorithm. Dash is an open source cryptocurrency. Ethereum uses Ethash as a PoW algorithm. Monero uses RandomX as a PoW algorithm. Ravencoin uses the X16R PoW algorithm.

Cryptocurrency mining is a competitive process that verifies and adds new transactions to a blockchain for a cryptocurrency that uses the PoW method. The miner that wins the competition is rewarded with some amount of currency and/or transaction fees.

High-performance mining systems employ a large number of mining ICs working in parallel on PoW algorithms. The large currents drawn by the hash boards on which the ICs are mounted lead to power delivery losses (IR drop), which impacts the overall system performance and profitability of the mining operations. To minimize power delivery losses, the mining systems leverage the uniform switching activity of mining operations and employ voltage stacking where a larger voltage across the stack is divided into smaller voltages across rows of ICs by ganging the Vcc (supply voltage)/Vss (source voltage) of two consecutive rows.

However, due to variations between the ICs, the current consumption and hence the voltage drop across the ICs can vary. The voltage drops should be regulated to allow for optimal efficiency and stability of the ICs. One approach is to provide system software, e.g., running at the controller 120, to regulate the voltage drops. For example, the software can periodically query an on-die voltage sensor of each IC to determine its voltage drop. If the voltage drop is out of a desired range, the software can adjust an operating frequency of a PLL of the IC. For example, if the voltage drop exceeds an upper threshold, the frequency can be reduced, and if the voltage drop falls below a lower threshold, the frequency can be increased. As mentioned, this approach results in an excessive load on the software and substantial traffic on a bus between the controllers and the ICs.

Figure 2:
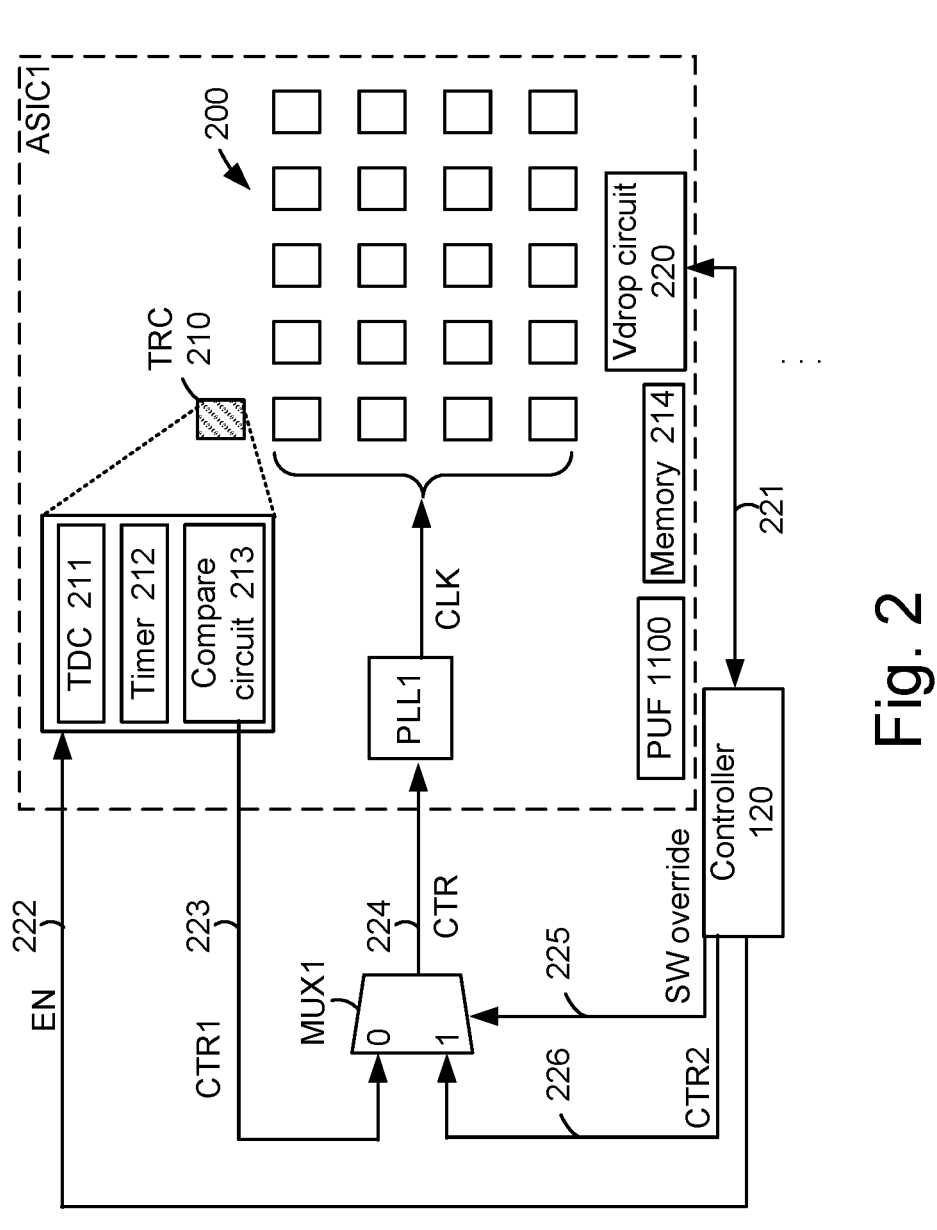
FIG. 2 depicts an example implementation of ASIC1 of FIG. 1 and an associated multiplexer, MUX1, in accordance with various embodiments.

FIG. 2 depicts an example implementation of ASIC1 of FIG. 1 and an associated multiplexer, MUX1, in accordance with various embodiments. This implementation overcomes the issues mentioned above, including excessive load on the software. ASIC1 is representative of each of the ASICs of FIG. 1. The other ASICs are not pictured here but can communicate with the same controller 120. ASIC1 includes a number of processing engines 200, such as mining engines in the case of cryptocurrency mining. The processing engines work in parallel on different input vectors to perform computations. For each die, the plurality of processing engines may work in parallel on computations of a cryptographic hashing algorithm such as SHA-256.

Additionally, a tunable replica circuit (TRC) 210 is provided on the ASIC1. The TRC is referred to as a replica circuit because may replicate characteristics of the processing engines such as a critical path. The TRC may also perform operations which replicate a subset of the operations of the processing engines.

The TRC may include a tunable delay circuit (TDC) 211, a timer 212 and a compare circuit 213. The timer determines a time period or delay of the TDC to perform an operation. The compare circuit 213 compares the delay to one or more threshold, such as lower and upper thresholds of an allowable range. If the delay is outside the allowable range, the compare circuit provides a first control signal CTR1 for adjusting the operating frequency of PLL1, a PLL of ASIC1. Each ASIC or other IC may have a respective PLL. The TDC may mimic the critical path of the ASIC to track its performance over voltage and temperature variations. The critical path of the ASIC can be defined as the longest time needed by any of the processing engines to perform a specified task. Each processing engine can be evaluated in a test mode to determine this time period. The delay of the TRC path may be longer, e.g., up to 1-5% longer, than the critical path so it will fail sooner than the processing engines. The delay of the TRC can be set depending on how well the TRC tracks the performance of the actual processing engines.

The TRC circuit can be designed and configured to fail sooner than the critical path of the processing engines and hence can be used to re-configure the PLL to maintain stable stack voltages. The TRC circuit can be designed to track both minimum and maximum delays and accordingly scale up or scale down, respectively, the PLL frequency. For example if the delay of the TRC falls below a lower threshold, the frequency of the PLL can be decreased. If the delay of the TRC falls exceeds an upper threshold, the frequency of the PLL can be increased. For example, see FIGS. 4A and 4B.

The TRC can be implemented with various designs for the TDC which mimic the critical path. That is, for each IC, the delay of the TDC is based on the delay of the critical path of the IC. The delay of the TDC can be a product of the critical path and a predetermined multiplier such as 1.01-1.05.

Figures 5A, 5B, 5C:
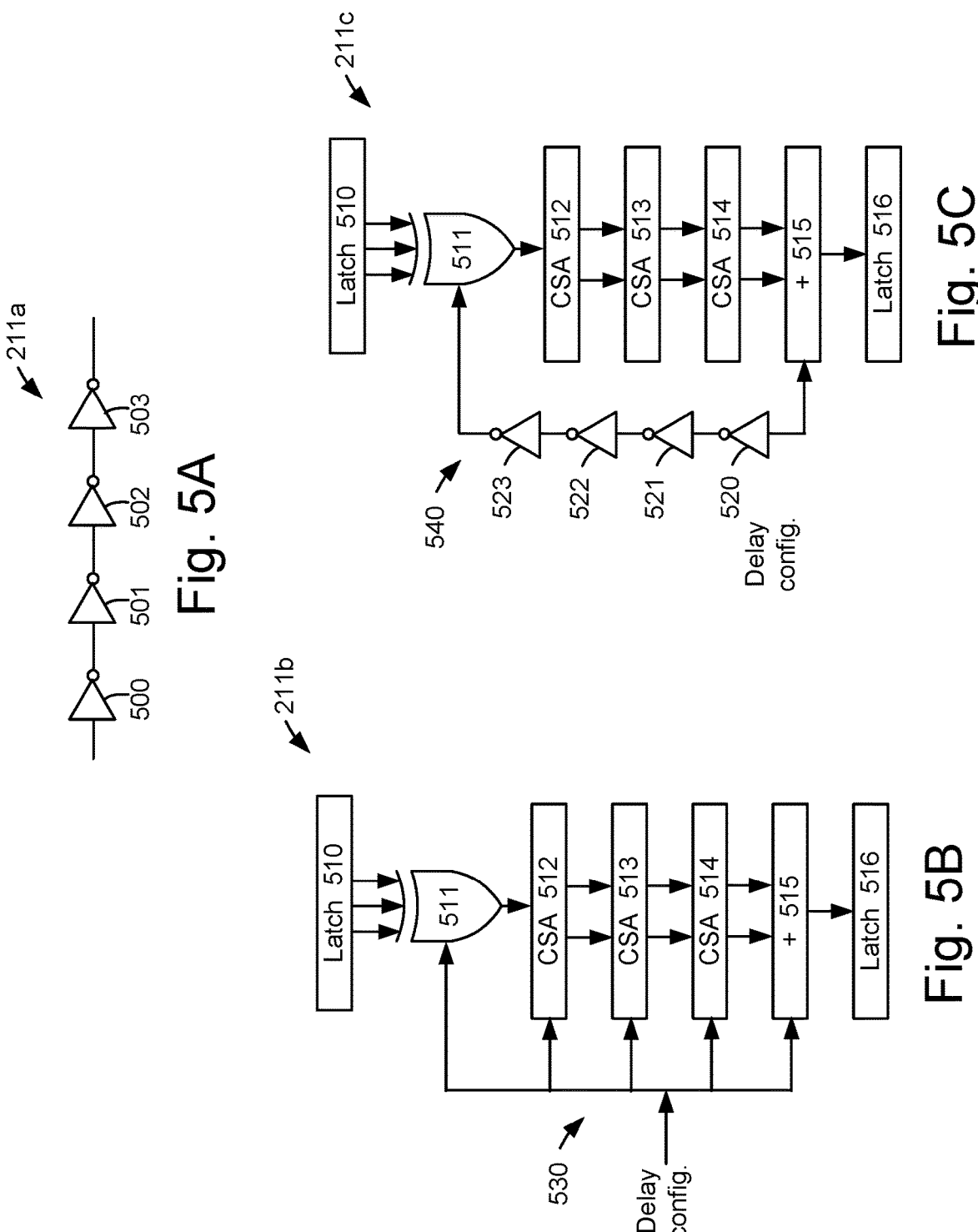
FIG. 5A depicts an example implementation of the tunable delay circuit 211 of FIG. 2 as a chain 211a of tunable inverters, in accordance with various embodiments.
FIG. 5B depicts an example implementation of the tunable delay circuit 211 of FIG. 2 as a tunable data path 211b, in accordance with various embodiments.
FIG. 5C depicts an example implementation of the tunable delay circuit 211 of FIG. 2 as a data path 211c with tunable launch/capture clock, in accordance with various embodiments.
Figure 5D:
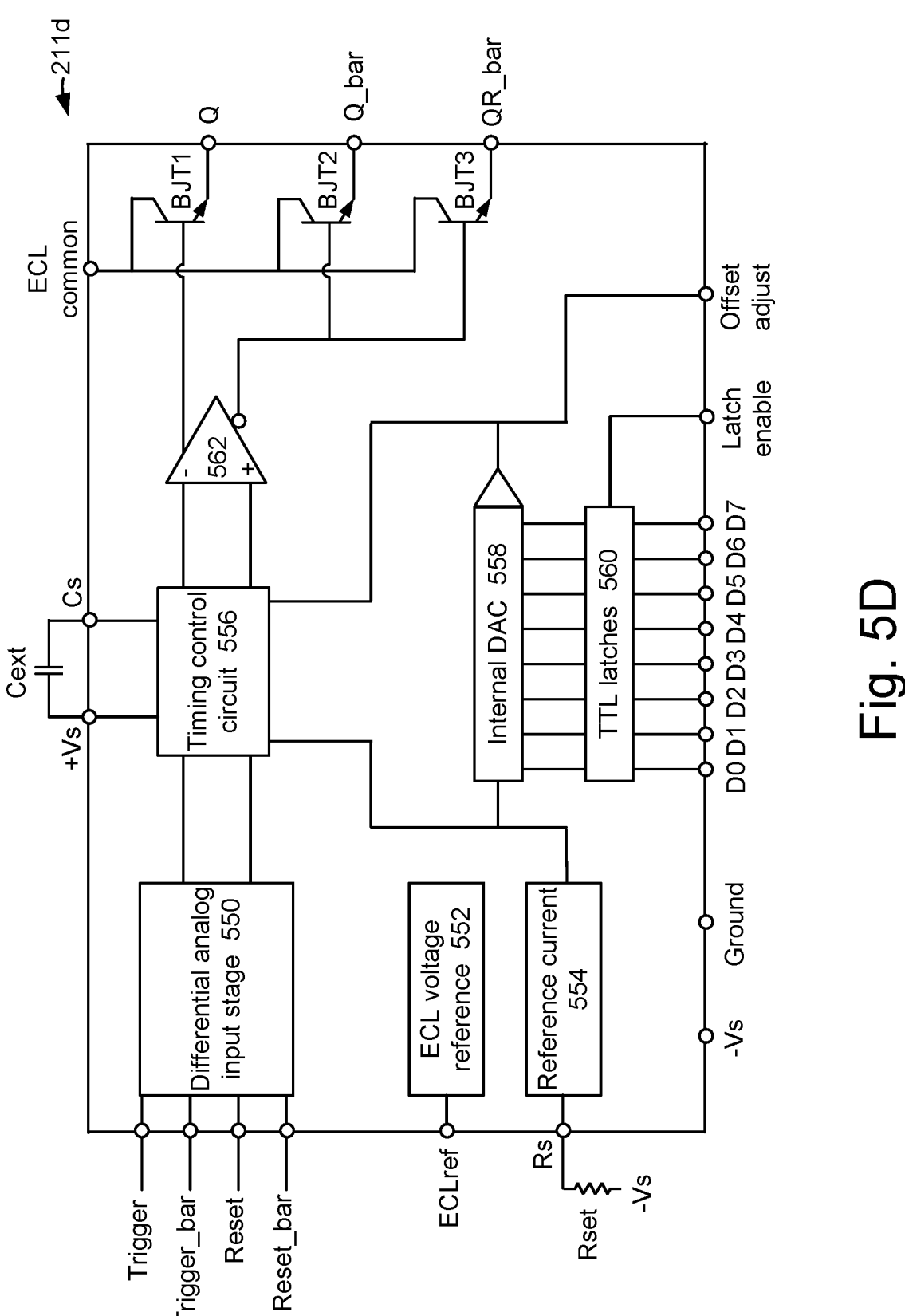
FIG. 5D depicts an example implementation of the tunable delay circuit 211 of FIG. 2 as a digitally programmable delay generator 211d, in accordance with various embodiments.

Example implementations include a chain of tunable inverters (FIG. 5A), a tunable data path (FIG. 5B), a data path with a tunable launch/capture clock (FIG. 5C) and a digitally programmable delay generator (FIG. 5D). Generally, the TRC can be implemented using any of the approaches shown in FIG. 5A-5C. FIG. 5A depicts a tunable inverter chain and its delay will be 'tuned' using digital configuration bits at config time to match the delay of the IC's critical path. This can be implemented as parallel chains of inverters of varying length and the config picks the inverter length that matches the IC critical path.

Or, to better match the voltage/temperature scaling characteristics of the IC, the TRC can be implemented as depicted in FIG. 5B, where a replica critical path circuit is used instead of inverters. Here also, the delay of the critical path circuits may be tuned using configuration bits to change the capacitive load on the critical path gates. FIG. 5C depicts a third approach which uses a tunable clock skew with the replica path to 'model' the behavior of the IC.

In this example, the TRC is on the IC, but could alternatively be provided off the IC such as on a board. Each IC can have its own TRC to account for the different critical paths of the different ICs.

The first control signal, CTR1, from the TRC 210 is received at a 0 input of a multiplexer, MUX1, via a path 223. A respective multiplexer can be provided for each IC. In this example, the multiplexer is off the IC, such as on a board but could alternatively be provided on the IC. MUX1 also receives a second control signal, CTR2, from the controller 120 at a 1 input via a path 226. A software (SW) override signal is also receive at MUX1 via a path 225 from the controller. The controller can trigger an override of the control signal from the TRC to assert its own control signal for PLL1. In particular, CTR1 at the first (0) input of MUX1 is passed to PLL1 if the override is not asserted and CTR2 at the second (1) input of MUX1 is passed to PLL1 if the override is asserted. The output of the MUX1 is a control signal CTR on a path 224 to the PLL1. An output from the PLL is a clock signal CLK to each of the processing engines.

The controller can make a decision of whether to assert the override based on data received from a Vdrop circuit 220 of the IC, an example of a voltage sense circuit, via a path 221. This circuit is an on-die voltage sensor that senses a voltage drop across the ASIC. Each IC can have a respective Vdrop circuit. The voltage drop is a difference between the supply (input) voltage and the source (output) voltage of the ASIC. The Vdrop circuit can be periodically queried by software running at the controller to detect the voltage seen on-die. Generally, the ICs in a row will have a common voltage drop since they are connected in parallel but there can be IC-to-IC variations within a row. The controller 120 can periodically transmit an enable signal (EN) to the TRC via a path 222. The TRC responds to the enable signal by measuring the delay of the TDC and outputting CTR1 if indicated to adjust the PLL. Advantageously, the delay varies as the critical path of the IC varies due to variations in factors such as voltage and temperature.

The system software of the controller may override the TRC and control the PLL such as to prevent damage to the ASIC, e.g., if the TRC is not working properly or is otherwise unable to keep Vdrop within a desired range.

In one approach, the controller 120 for a set of ICs is a single controller such as an FPGA, a small controller or a micro-controller which can run the system software for the set of ICs. The ICs themselves do not run any software, in one possible implementation.

The ASIC may include a memory 214 to store an identifier which it generates. The memory may be a volatile memory such as RAM.

The ASIC may include a physically unclonable function (PUF) circuit 1100 to generate an identifier of the ASIC as discussed further below, e.g., in connection with FIG. 11.

Figure 3:
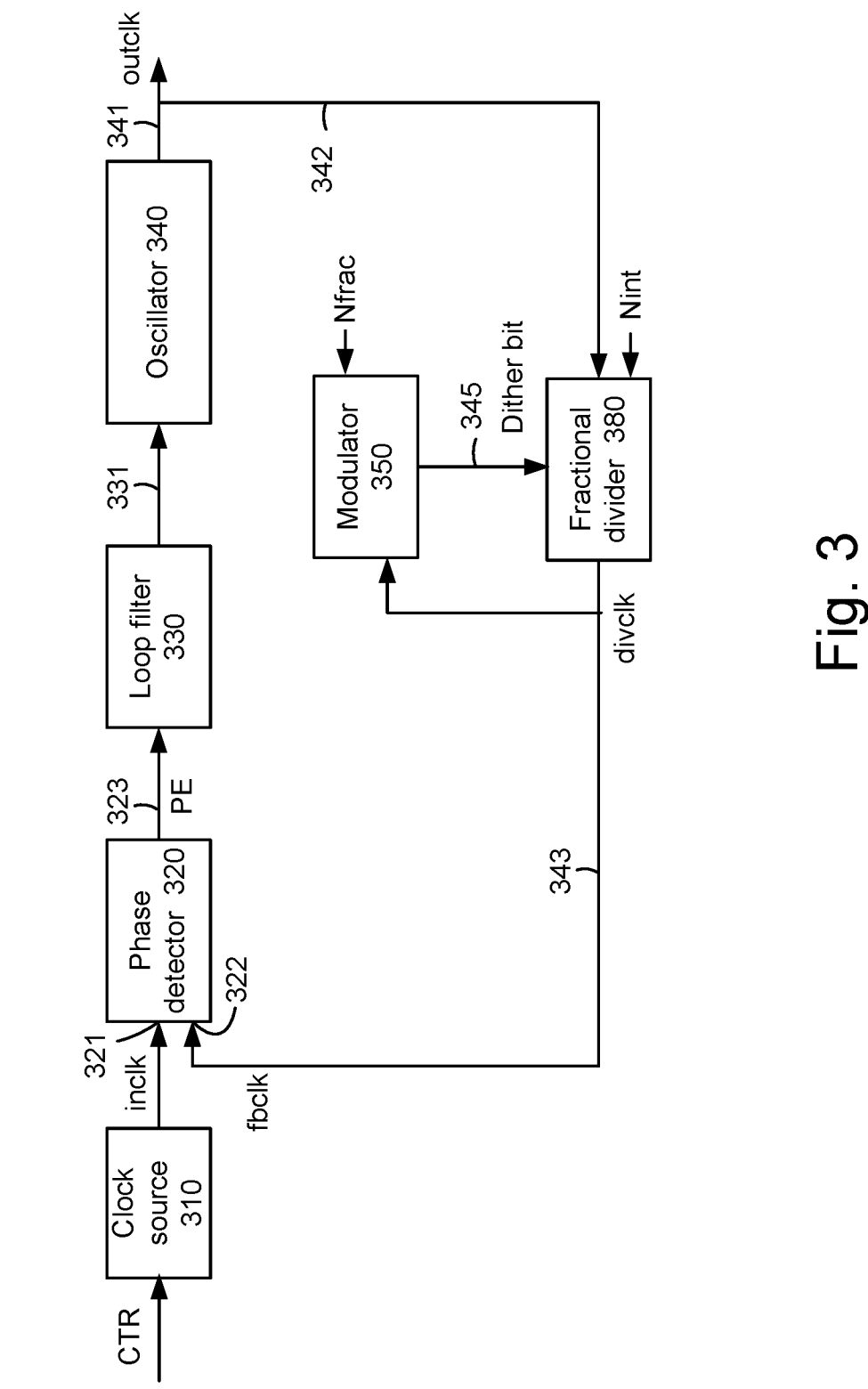
FIG. 3 illustrates an example implementation of the phase-locked loop, PLL1, of FIG. 2 in accordance with various embodiments.

FIG. 3 illustrates an example implementation of PLL1 of FIG. 2 in accordance with various embodiments. The PLL receives an input clock signal (inclk) from a clock source 310 such as a crystal oscillator. The input clock signal is received at a first input terminal 321 of a phase detector 320. A feedback clock signal (fbclk) is received at a second input terminal 322 of the phase detector. Based on a phase difference between the two input signals, the phase detector provides an output signal (phase error PE) on a path 323 for use by a loop filter 330. The loop filter provides a corresponding output signal on the path 331 to control the oscillator 340. The oscillator provides the output clock signal, outclk, on the path 341. For example, the phase detector, loop filter and oscillator can be digitally-implemented, in which case the signals on the paths 323 and 331 are digital codes or code words. Outclk in turn is provided to the processing engines of an IC, as depicted in FIG. 2.

In one possible implementation, a digital phase detector can comprise an exclusive-OR (XOR) logic gate. When the two signals being compared are completely in-phase, the XOR gate's output will have a constant level of zero. When the two signals differ in phase, the XOR gate's output will be high for a portion of each cycle which is proportional to the difference in phase. The output of the XOR gate thus changes duty cycle in proportion to the phase difference. The output can be applied to a low-pass filter to obtain an analog voltage that is proportional to the phase difference between the two signals. The phase difference can then be converted to a code word using an analog-to-digital converter. The input clock signals can be square waves.

In other possible implementations, a digital phase detector can be based on a sample and hold circuit, a charge pump, or a logic circuit comprising flip-flops. In another approach, the phase detector has an analog implementation.

The loop filter converts the signal representing the phase difference to a signal on path 331 for the oscillator 340. For example, in an all-digital implementation of the PLL, a digital loop filter can convert a code word representing the phase difference on the path 323 to a code word representing an output frequency, or a change in an output frequency, for the digitally-controlled oscillator on the path 331. The digital loop filter may be a proportional-integral filter which includes a proportional gain summed with an output of an integrator. The path 331 may be a digital bus, in this case, and the oscillator may be a synthesized digitally-controlled oscillator.

Alternatively, in a hybrid digital implementation, the path 331 may be coupled to a digital to analog converter (DAC) which, in turn is coupled to an analog oscillator. The DAC translates the code provided by the loop filter to an analog signal for controlling the oscillator.

In either case, the oscillator adjusts its output clock signal, outclk, based on the signal received from the filter, such that the loop filter controls the frequency and phase of the oscillator.

Outclk is also provided on a feedback path of the PLL which is coupled to the second input terminal 322 of the phase detector. The feedback path includes paths 342 and 343 and a fractional divider 380. Outclk is provided to the fractional divider on a path 342. Outclk is divided in frequency by the fractional divider to provide the divided clock signal, divclk. Divclk=fbclk in this example. In one approach, the division is by an integer N for some cycles and by an integer N+1 for other cycles. For example, assume it is desired to provide outclk at a frequency (f)=10.01 GHz and that the frequency of inclk is 100 MHz. In this case, outclk can be divided by 100 for nine cycles of divclk and by 101 for one cycle of divclk. On average, outclk is divided by 100.1, where 10.01 GHz/100.1=100 Mhz. This process is repeated in consecutive divide cycles, where a divide cycle comprises ten cycles of divclk in this example. A divide cycle can comprise multiple divisions by N and one division by N+1, in one example. With the fractional division, the frequency of fbclk, on average, matches the frequency of inclk.

A modulator 350 is coupled to the fractional divider 380 to inform the divider of when to switch divisors using a dither bit on a path 345. The modulator may be a delta-sigma modulator, for example. The fractional divider can therefore switch between the divisors N and N+1 using the dither bit, in one approach. The modulator is also coupled to the path 343 to detect each cycle of divclk. The modulator can determine when a new division cycle starts by counting the cycles of divclk. When a division cycle starts, the dither bit is set to one value, e.g., 0, to indicate the divisor N is to be used by the divider. The dither bit is then maintained at 0 until the last cycle of divclk in the division cycle. The dither bit is then set to another value, e.g., 1, to indicate the divisor N+1 is to be used by the divider. The modulator receives the value Nfrac and the divider receives the value Nint from a control circuit. The overall frequency ratio from outclk to inclk is Nint+Nfrac, where Nint is the integer value and Nfrac is the fractional value. In the example discussed above, Nint=100 and Nfrac=0.1

The PLL can be integrated in a Very Large Scale Integration (VLSI) device as a circuit within a chip.

Figures 4A, 4B, 4C, 4D:
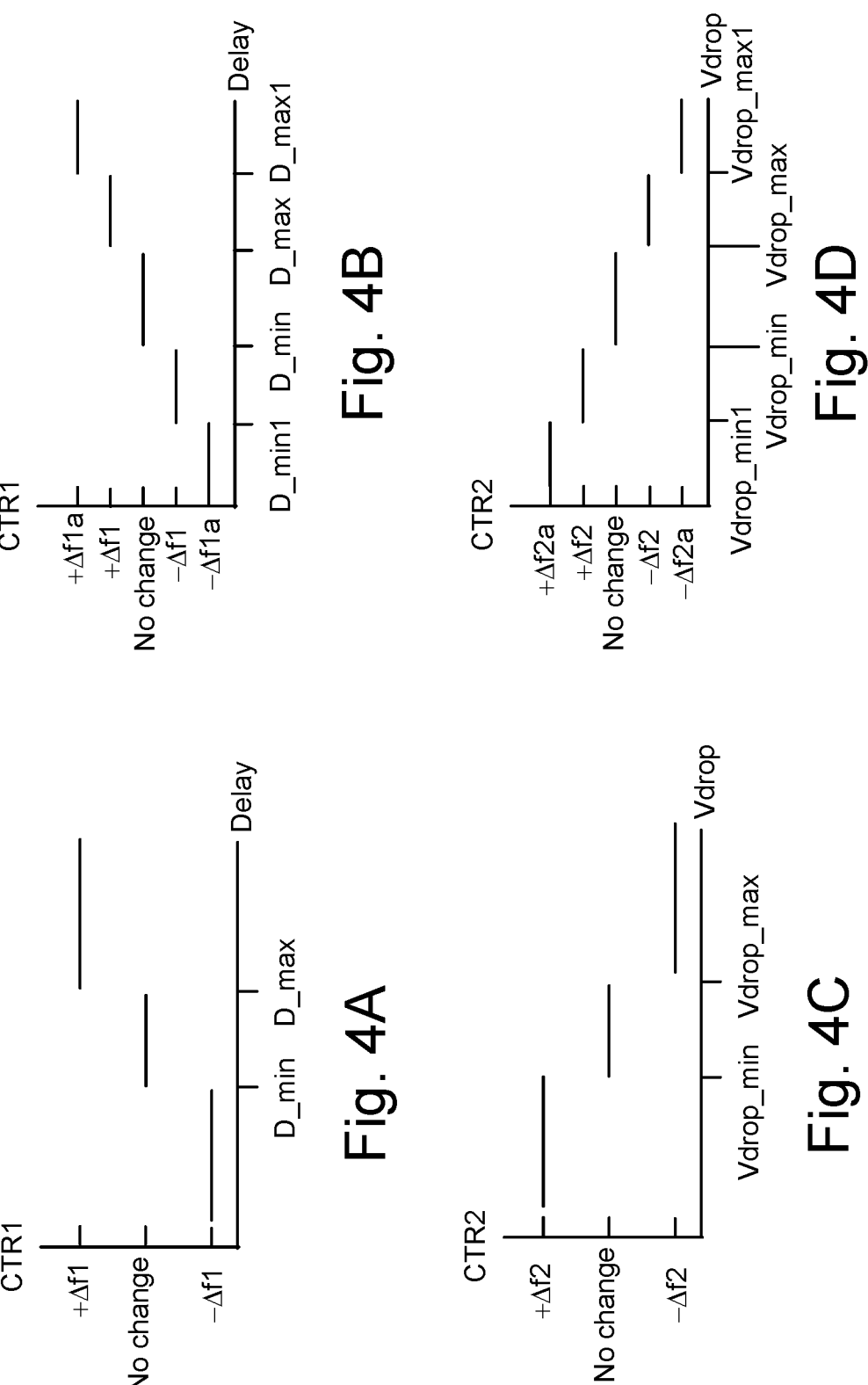
FIG. 4A depicts an example plot of a first control signal, CTR1, of the tunable replica circuit 210 of FIG. 2, versus a delay, in accordance with various embodiments.
FIG. 4B depicts another example plot of a first control signal, CTR1, of the tunable replica circuit 210 of FIG. 2, versus a delay, in accordance with various embodiments.
FIG. 4C depicts an example plot of a second control signal, CTR2, of the controller 120 of FIG. 2, versus a voltage drop, Vdrop, of the Vdrop circuit 220 of FIG. 2, in accordance with various embodiments.
FIG. 4D depicts another example plot of a second control signal, CTR2, of the controller 120 of FIG. 2, versus a voltage drop, Vdrop, of the Vdrop circuit 220 of FIG. 2, in accordance with various embodiments.

FIG. 4A depicts an example plot of a first control signal, CTR1, of the tunable replica circuit 210 of FIG. 2, versus a delay, in accordance with various embodiments. In FIGS. 4A and 4B, the plot depicts CTR1 on a vertical axis and a delay of the TDC 211 on the horizontal axis. In FIG. 4A, the delay is compared to an upper threshold, D_max, and a lower threshold, D_min. These thresholds define an allowable range of delays. If the delay is within the allowable range, there is no change to the clock frequency so that CTR1 need not be communicated to PLL1. If the delay exceeds D_max, e.g., the TRC is running too slow, CTR1 is set to indicate the clock frequency should increase by a first increment, $+\Delta f1$, and is communicated to PLL1. If the delay is less than D_min, e.g., the TRC is running too fast, CTR1 is set to indicate the clock frequency should decrease by the first increment, $-\Delta f1$, and is communicated to PLL1. In this approach, the magnitudes of the positive and negative increments are the same. In another approach, the magnitudes of the positive and negative increments differ.

By periodically adjusting the reference clock frequency of the PLL, the amount of current drawn by the IC and the associated voltage drop of the IC can be stabilized in view of voltage and temperature variations. The voltage drop of each IC in a voltage-stacked configuration can therefore also be stabilized and equalized.

In another option, the delay is compared to the upper threshold but not the lower threshold, or to the lower threshold but not the upper threshold.

With the plots of FIGS. 4A and 4B, the TRC of an IC can periodically output a control signal CTR1 to adjust the frequency of a PLL of the IC. This process can be repeated in each IC, either concurrently or sequentially, one IC at a time. CTR1 instructs the clock source 310 of FIG. 3 to change its clock, inclk, which is used as a reference in the PLL.

FIG. 4B depicts another example plot of a first control signal, CTR1, of the tunable replica circuit 210 of FIG. 2, versus a delay, in accordance with various embodiments. This example provides a finer grained control of the clock frequency by classifying the delay into five possible ranges instead of three. In this example, the delay is compared to first and second upper thresholds, D_max and D_max1, respectively, and to first and second lower thresholds, D_min and D_min1, respectively. If D_min<Delay<D_max, there is no change to the clock frequency so that CTR1 need not be communicated to PLL1. If D_max≤Delay<D_max1, CTR1 is set to indicate the clock frequency should increase by a first increment, $+\Delta f1$, and is communicated to PLL1. If Delay≥D_max1, CTR1 is set to indicate the clock frequency should increase by a second increment, $+\Delta f1a$, larger in magnitude than the first increment, and is communicated to PLL1. If D_min1<Delay≤D_min, CTR1 is set to indicate the clock frequency should decrease by a first increment, $-\Delta f1$, and is communicated to PLL1. If Delay≤D_min1, CTR1 is set to indicate the clock frequency should decrease by a second increment, $-\Delta f1a$, larger in magnitude than the first increment, and is communicated to PLL1. The increment $\Delta f1$ in FIG. 4B can be the same as, or different than, in FIG. 4A.

FIG. 4C depicts an example plot of a second control signal, CTR2, of the controller 120 of FIG. 2, versus a voltage drop, Vdrop, of the Vdrop circuit 220 of FIG. 2, in accordance with various embodiments. As mentioned, the controller 120 has the ability to override a control signal of the TRC in adjusting the clock frequency of the PLL. This can be done on occasion such as when the TRC is not able to keep the voltage drop of an IC within an acceptable range. The controller can receive data indicating a voltage drop, Vdrop, in an IC and compare Vdrop to one or more thresholds to determine whether to take an action in adjusting the clock frequency of the PLL. The controller can collect Vdrop data periodically in parallel with the operation of the TRC generating delay data.

In FIGS. 4C and 4D, the plot depicts CTR2 on a vertical axis and Vdrop on the horizontal axis. In FIG. 4C, Vdrop is compared to an upper threshold, Vdrop_max, and a lower threshold, Vdrop_min. These thresholds define an allowable range of Vdrop. If Vdrop is within the allowable range, there is no change to the clock frequency so that CTR2 need not be communicated to PLL1. If Vdrop≥Vdrop_max, e.g., the IC is running too fast, and CTR2 is set to indicate the clock frequency should decrease by a first increment, $-\Delta f2$, and is communicated to PLL1. If Vdrop≤Vdrop_min, e.g., the IC is running too slow, CTR2 is set to indicate the clock frequency should increase by the first increment, $+\Delta f2$, and is communicated to PLL1. In this approach, the magnitudes of the positive and negative increments are the same. In another approach, the magnitudes of the positive and negative increments differ. When the controller provides CTR2 to MUX1 in FIG. 2, it also asserts the SW override signal so that MUX1 will pass CTR2 to the PLL. At other times, the controller de-asserts the SW override signal so that MUX1 will pass CTR1 to the PLL.

By adjusting the reference clock frequency of the PLL on an as needed basis when the TRC is not able to keep Vdrop within an acceptable range, the controller can stabilize the voltage drop and avoid potential damage to the IC.

In another option, Vdrop is compared to the upper threshold but not the lower threshold, or to the lower threshold but not the upper threshold.

This process can be implemented in each IC, to allow the controller to override the control signal of the TRC of the IC on an as-needed basis.

For the one or more of the die, the second control signal is to replace the first control signal when the voltage drop of the one or more of the die is beyond at least one of a lower threshold or an upper threshold.

FIG. 4D depicts another example plot of a second control signal, CTR2, of the controller 120 of FIG. 2, versus a voltage drop, Vdrop, of the Vdrop circuit 220 of FIG. 2, in accordance with various embodiments. This example provides a finer grained control of the clock frequency by classifying Vdrop into five possible ranges instead of three. In this example, Vdrop is compared to first and second upper thresholds, Vdrop_max and Vdrop_max1, respectively, and to first and second lower thresholds, Vdrop_min and Vdrop_min1, respectively. If Vdrop_min<Vdrop≤Vdrop_max, there is no change to the clock frequency so that CTR2 need not be communicated to PLL1. If Vdrop_max≤Vdrop<Vdrop_max1, CTR2 is set to indicate the clock frequency should decrease by a first increment, $-\Delta f2$, larger in magnitude than the first increment, and is communicated to PLL1. If Vdrop≥Vdrop_max1, CTR2 is set to indicate the clock frequency should decrease by a second increment, $-\Delta f2a$, and is communicated to PLL1. If Vdrop_min1<Vdrop≤Vdrop_min, CTR2 is set to indicate the clock frequency should increase by a first increment, $+\Delta f2$, and is communicated to PLL1. If Vdrop≤Vdrop_min1, CTR2 is set to indicate the clock frequency should increase by a second increment, $+\Delta f2a$, larger in magnitude than the first increment, and is communicated to PLL1. The increment Δf2 in FIG. 4D can be the same as, or different than, in FIG. 4C.

FIG. 5A depicts an example implementation of the tunable delay circuit 211 of FIG. 2 as a chain 211a of tunable inverters, in accordance with various embodiments. As mentioned, example implementations of the TDC 211 of FIG. 2 include a chain of tunable inverters (FIG. 5A), a tunable data path (FIG. 5B) or a data path with a tunable launch/capture clock (FIG. 5C). A goal of the TDC is to perform a predetermined operation or task which is timed by the timer 212 to provide a delay metric. The delay metric in turn is used to determine whether to adjust the clock frequency of the PLL, to maintain the Vdrop of an IC within a desired range. The clock frequency can be set at an initial level which is believed to be appropriate for the IC.

In one approach, an IC is fabricated with multiple processing engines and a TDC. The processing engines are then tested to determine the critical path of the IC. The TDC is then adjusted or tuned to mimic the critical path. This process can be performed for each IC.

In FIG. 5A, the TDC includes a chain or series of inverters 500-503. The TDC may be initially fabricated with different paths to choose from, where each path has a different number of inverters and therefore a different delay. One of the paths is then enabled which corresponds to the desired delay.

The first inverter 500 receives a signal which changes from low to high, for example, and, in response, outputs a signal which changes from high to low after a delay t1. The second inverter 501 receives the output signal from the first inverter and, in response, outputs a signal which changes from low to high after a delay t2. The third inverter 502 receives the output signal from the second inverter and, in response, outputs a signal which changes from high to low after a delay t3. Finally, the fourth inverter 503 receives the output signal from the third inverter and, in response, outputs a signal which changes from low to high after a delay t4. The sum of the delays t1+t2+t3+t4 represents the total delay of the chain of inverters. The timer 212 can begin running when there is a change in the signal level at the input of the chain and stop running when there is a change in the signal level at the output of the chain, to determine the delay. In one option an additional tunable delay component is placed in series with the chain of inverters.

FIG. 5B depicts an example implementation of the tunable delay circuit 211 of FIG. 2 as a tunable data path 211b, in accordance with various embodiments. FIG. 5C depicts an example implementation of the tunable delay circuit 211 of FIG. 2 as a data path 211c with tunable launch/capture clock, in accordance with various embodiments.

The TDC can be configured to mimic the operations performed by the processing engines. For example, the TDCs of FIGS. 5B and 5C uses a series of carry-save adders (CSAs) to mimic the carry-save operations of the SHA-256 hash function performed by the processing engines when the processing engines are cryptocurrency mining engines. FIGS. 5B and 5C both include a data path comprising a latch 510 which provides data three data outputs to an exclusive-or (XOR) gate 511. The XOR gate provides an output to a first CSA 512, which provides two outputs to a second CSA 513, which in turn provides two outputs to a third CSA 514. The third CSA provides two outputs to an adder 515 which in turn provide data to a latch 516.

In FIG. 5A, the arrows 530 indicates that a delay configuration (config.) can be implemented for one or more of the XOR gate 511 and the CSAs 512-614 to adjust their delays, to achieve a desired overall delay.

In FIG. 5C, a chain 540 of inverters 520-523 is provided, similar to the chain 211a of FIG. 5A, to configure a delay of the XOR gate 511 and/or the adder 515.

FIG. 5D depicts an example implementation of the tunable delay circuit 211 of FIG. 2 as a digitally programmable delay generator 211d, in accordance with various embodiments. Various other delay components can be used as well. For example, a digitally programmable delay generator can provide programmed delays which are selected by a digital code. One example is the AD9500, available from Analog Devices, Inc., Norwood, Mass. The digitally programmable delay generator can be used alone or in series with other delay circuits such as those in FIG. 5A-5C.

The example digitally programmable delay generator 211d provides programmed delays which are selected through an 8-bit digital code. The delay generator includes a differential analog input stage 550 which provides outputs to a timing control circuit 556. The timing control circuit provides outputs to an amplifier 562. The amplifier is coupled to bipolar junction transistors (BJTs) BJT1-BJT3 which provide respective outputs Q, Q_bar and QR_bar. The delay is set using eight bits D0-D7, where D0 is the least-significant bit (LSB) and D7 is the most-significant bit (MSB). The data is latched at transistor-transistor logic (TTL) latches 560 before being provided to an internal digital-to-analog convert (DAC) 558. The timing control circuit is responsive to a current from a reference current generator 554, an output of the internal DAC and an offset adjust signal. An emitter-coupled logic (ECL) voltage reference 552 is also provided.

The delay generator comprise NPN bipolar junction transistors (BJTs) for high speed operation. The delay generator employs differential TRIGGER and RESET inputs which are designed primarily for ECL signal levels but function with analog and TTL input levels. An onboard ECL reference midpoint allows both of the inputs to be driven by either single ended or differential ECL circuits. The delay generator output is a complementary ECL stage, which also provides a QR parallel output circuit to facilitate reset timing implementations. Digital control data is passed to the delay generator through a transparent latch controlled by the LATCH ENABLE signal. In the transparent mode, the internal DAC attempts to follow changes at the inputs. The LATCH ENABLE is otherwise used to strobe the digital data into the latches.

ECLref is the ECL midpoint reference, nominally −1.3 V. Offset Adjust is used to adjust the minimum propagation delay by pulling or pushing a small current out of or into the pin. Cs allows the full-scale range to be extended by using an external timing capacitor, Cext, connected between Cs and +Vs, the positive supply terminal, nominally +5.0 V. Trigger is the non-inverted input of the edge-sensitive differential trigger input stage. The output at Q will be delayed by the programmed delay, after the triggering event. The programmed delay is set by the digital input word. The Trigger input is driven in conjunction with the Trigger_bar input. Trigger_bar is the inverted input of the edge-sensitive differential trigger input stage. Reset_bar in the inverted input of the level-sensitive differential reset input stage. The output at Q will be reset after a signal is received at the reset inputs. The minimum output pulse width will be equal to the reset propagation delay, tRD. Reset_bar is driven in conjunction with the Reset input. Reset is the noninverted input of the level-sensitive differential reset input stage. Q is one of two complementary ECL outputs.

A triggering event at the inputs will produce a logic HIGH on the Q output. A resetting event at the inputs will produce a logic LOW on the Q output. Q_bar is the other of the two complementary ECL outputs. The QR_bar output is parallel to the Q_bar output. QR_bar is typically used to drive delaying circuits for extending output pulse widths. A triggering event at the inputs will produce a logic LOW on the QR_bar output. A resetting event at the inputs will produce a logic HIGH on the QR_bar output. ECL common is the collector common for the ECL output stage. The collector common may be tied to +5.0 V, but normally it is tied to the circuit ground for standard ECL outputs. −Vs is the negative supply terminal, nominally −5.2 V. Rs is the reference current setting terminal. An external setting resistor, Rset, connected between Rs and −Vs, determines the internal reference current. Ground is the ground return for the TTL and analog inputs. Latch enable is the transparent TTL latch control line. A logic HIGH on Latch enable freezes the digital code at the logic inputs. A logic LOW on Latch enable allows the internal current levels to be continuously updated through the logic inputs D0 thru D7.

Figures 6, 7:
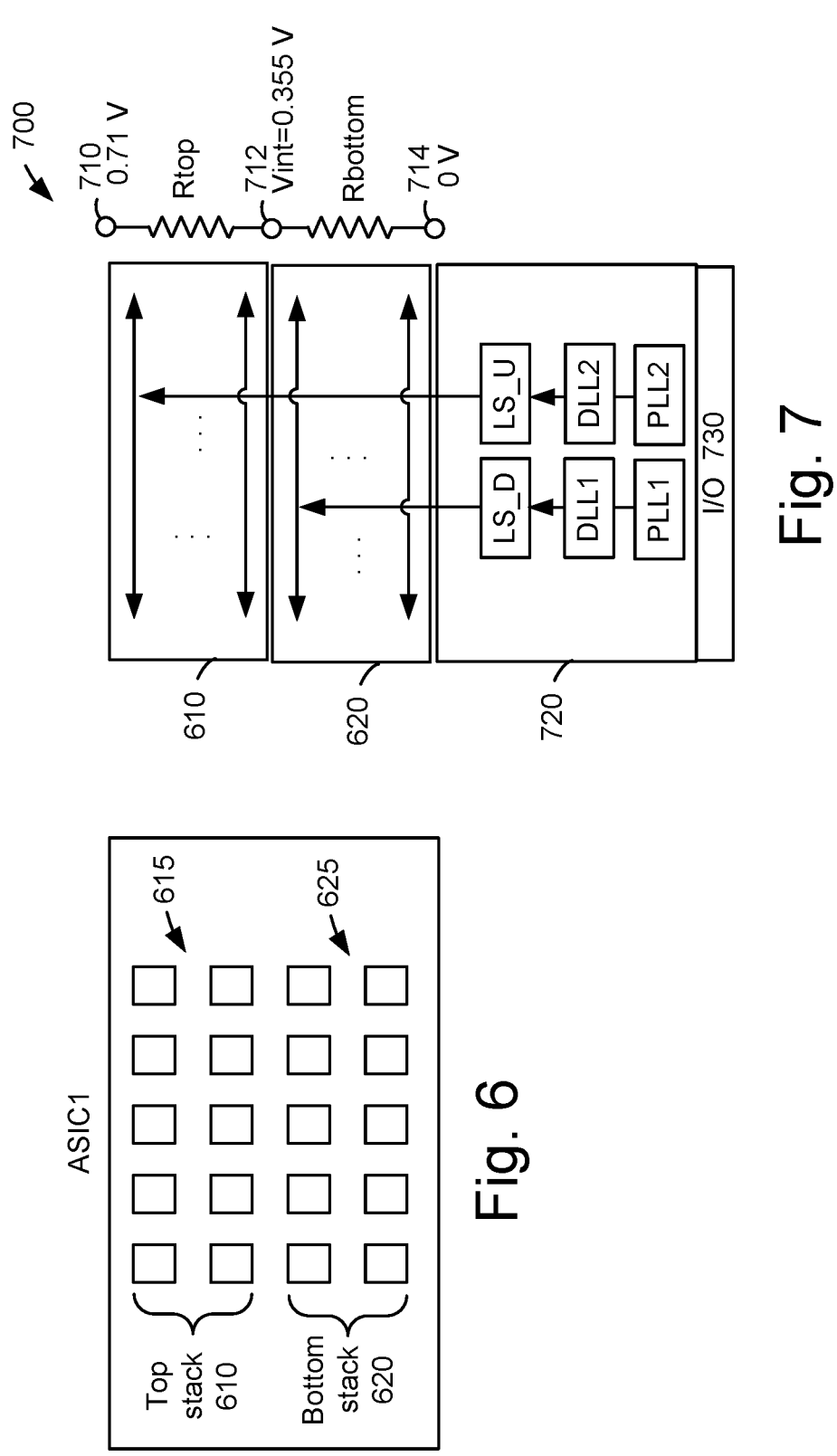
FIG. 6 depicts an example implementation of ASIC1 of FIG. 2 with a top stack 610 and a bottom stack 620 in a voltage-stacked configuration, in accordance with various embodiments.
FIG. 7 depicts an example implementation of ASIC1 of FIG. 6, in accordance with various embodiments.

FIG. 6 depicts an example implementation of ASIC1 of FIG. 2 with a top stack 610 and a bottom stack 620 in a voltage-stacked configuration, in accordance with various embodiments. As mentioned, voltage stacking of ICs can be performed to minimize power delivery losses, where a voltage is divided across multiple ICs or rows of ICs in series. However, this type of voltage stacking for ICs on a board requires the overhead cost of maintaining a large number of ICs in voltage stacked chain. For example, software may be required to maintain and balance the ICs in the serial chain, so that each of them have a similar voltage/current profile. Further, the efficiency of a power-supply unit (PSU) which provides the voltage can be degraded due to the requirement for a relatively low current across many channels.

Another approach, which can be used with or without IC-level voltage stacking, involves arranging different portions of an IC, such as top and bottom stacks of processing engines, in a voltage-stacked configuration. This is an example of intra-IC voltage stacking. In an example implementation, a deep n-well substrate configuration is used to create an isolated region, where one portion of the processing engines, such as the top stack 610 of processing engines 615, is fabricated on the deep n-well and another portion of the processing engines, such as the bottom stack 620 of processing engines 625, is fabricated outside the deep n-well, in the bulk p-substrate. The top and bottom stacks may have an equal number of processing engines in one approach.

A deep n-well configuration can be used to implement a balanced number of processing engines or cores in two separate voltage domains. A current profile across the voltage domains can be balanced by programming an equal distribution of workloads to draw similar current across the stacks. This creates balanced stacks where a voltage drop of the IC is split across each domain in to two voltage domains internally using a floating ground. A number of advantages can be achieved, including reducing an IR drop on the voltage supply to the chip, efficiently splitting the voltage inside the chip, reducing a noise coupling effect, and avoiding the area overhead cost of implementing isolation cells across different on-die voltage domains.

FIG. 7 depicts an example implementation of ASIC1 of FIG. 6, in accordance with various embodiments. A supply voltage of the IC and the top stack 610, e.g., 0.71 V, is applied at a node 710. A source voltage of the top stack, e.g., 0.355, which is also an intermediate voltage, Vint, of the IC, is at a node 712. This is also the supply voltage of the bottom stack 620. A source voltage of the bottom stack, e.g., 0 V, is at a node 714. A peripheral area 720 of the IC includes a high-to-low level shifter, LS_D, for the bottom stack, and a low-to-high level shifter, LS_U, for the top stack. LS denotes a level shifter, _D denotes a down shift in voltage and _U denotes an up shift in voltage. Rtop and Rbottom represent a resistance of the top and bottom stacks, respectively. The level shifters LS_D and LS_U are responsive to signals from delay-locked loops DLL1 and DLL2, respectively. The delay-lock loops can have a duty cycle variation. DLL1 and DLL2 in turn are responsive to phase-locked loops PLL1 and PLL2, respectively.

The PLLs may operate at twice a clock frequency, e.g., at 2 GHz. The vertical and horizontal arrows depicted for the top and bottom stacks represent this 2 GHz clock being distributed to the processing engines in the top and bottom stacks.

An input/output (I/O) region 730 of ASIC1 can be used to communicate with the controller 120, for example, or with other ICs.

Figure 8:
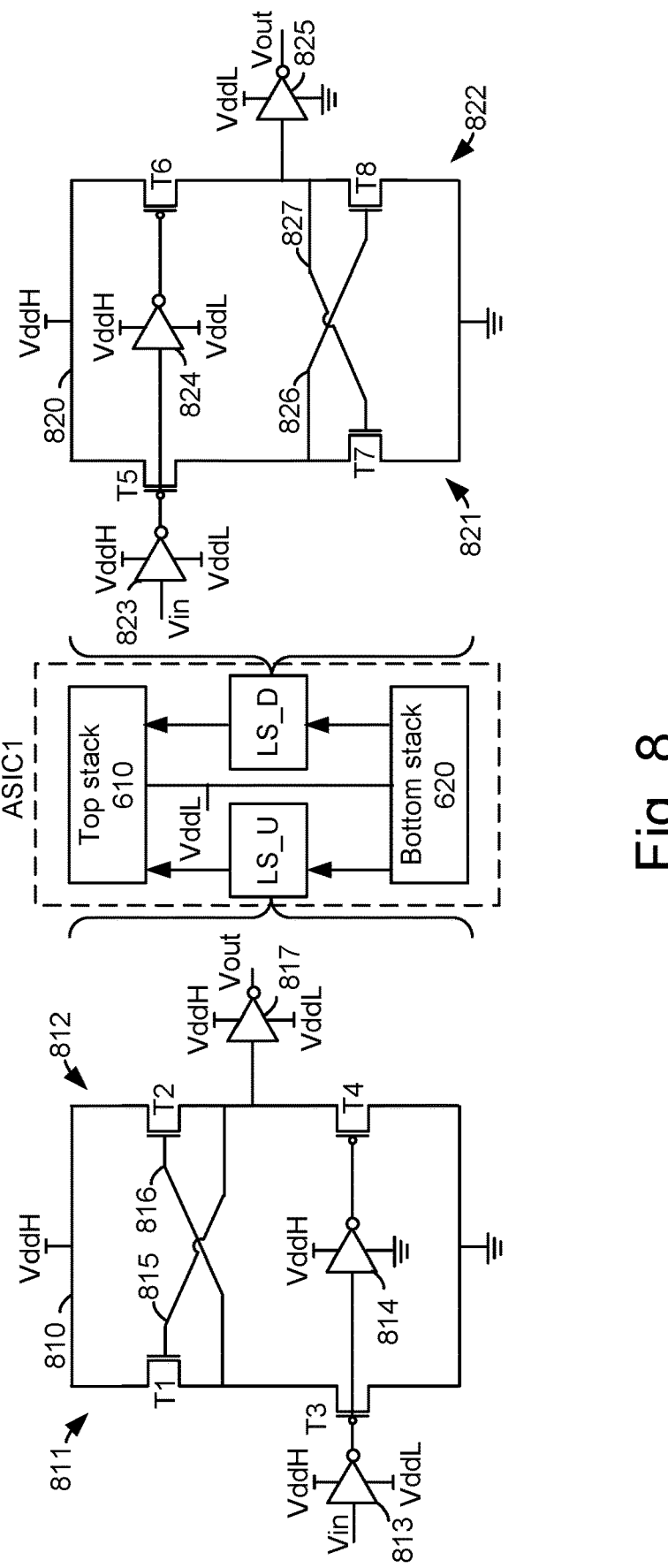
FIG. 8 depicts an example implementation of the up level shifter, LS_U, and the down level shifter, LS_D, of FIG. 7, in accordance with various embodiments.

FIG. 8 depicts an example implementation of the up level shifter, LS_U, and the down level shifter, LS_D, of FIG. 7, in accordance with various embodiments. Custom level-shifters can be implemented for safer signal crossings across the internally created voltage domains. ASIC1, including the top stack 610, bottom stack 620, LS_U and LS_D are depicted. An example implementation of the up shifter, LS_U, is depicted at the left side of the figure, while an example implementation of the down shifter, LS_D, is depicted at the right side of the figure. LS_U shifts the voltage range 0-7.1 V across the IC to 0.355-7.1 V for the top stack, and LS_D shifts the voltage range 0-7.1 V across the IC to 0-0.355 V for the bottom stack. VddH is the voltage at the node 710 and VddL is the intermediate voltage at the node 712 in FIG. 7.

In LS_U, VddH is supplied at a node 810. A first path 811 includes an nMOS transistor T1 and a PMOS transistor T3 in series and coupled to ground. A second path 812 includes an nMOS transistor T2 and a PMOS transistor T4 in series and coupled to ground. The control gate of T1 is coupled to the second path 812 by a path 815, and the control gate of T2 is coupled to the first path 811 by a path 816, in a cross-coupled configuration. A first inverter 813 receives an input voltage Vin and outputs the inverse of Vin to the control gate of T3 and to a second inverter 814. The first inverter 813 is biased by VddH and VddL while the second inverter 814 is biased by VddH and ground. The second inverter outputs Vin to the control gate of T4. A third inverter 817 has an input coupled to the second path 812 between T2 and T4, and provides an output voltage Vout. Vin can vary between low and high states.

When Vin is in a low state, e.g., at ground, the voltage at the control gate of T3 is high so that T3 turns off. Due to the inverter 814, the voltage at the control gate of T4 is low so that T4 turns on and the input of the inverter 817 is coupled to ground. As a result, the output of the inverter 817 is high, at VddH.

Conversely, when Vin is in a high state, the voltage at the control gate of T3 is low so that T3 turns on and the voltage at the control gate of T4 is high so that T4 turns off. VddH at the node 810 is passed to the input of the inverter 817 so that Vout is low, at VddL.

In LS_D, VddH is supplied at a node 820. A first path 821 includes a pMOS transistor T5 and an nMOS transistor T7 in series and coupled to ground. A second path 822 includes a pMOS transistor T6 and an nMOS transistor T8 in series and coupled to ground. The control gate of T7 is coupled to the second path 822 by a path 827, and the control gate of T8 is coupled to the first path 821 by a path 826, in a cross-coupled configuration. A first inverter 823 receives an input voltage Vin and outputs the inverse of Vin to the control gate of T5 and to a second inverter 824. The first and second inverters are biased by VddH and VddL while a third inverter 825 is biased by VddL and ground. The second inverter outputs Vin to the control gate of T6. The third inverter 825 has an input coupled to the second path 822 between T6 and T8, and provides an output voltage Vout, which can be different than for the LS_U circuit. Vin can vary between 0 V and a positive voltage.

When Vin is in a low state, e.g., at ground, the voltage at the control gate of T5 is high so that T5 turns off. Due to the inverter 824, the voltage at the control gate of T6 is low so that T6 turns on. VddH at node 820 is then passed to the input of the inverter 825 so that Vout=0 V. Conversely, when Vin is in a high state, the voltage at the control gate of T5 is low so that T5 turns on and the voltage at the control gate of T6 is high so that T6 turns off. VddH at the node 820 is passed to the path 826 to turn on T8, connecting the input of the inverter 825 to ground. With this low input, Vout is high, at VddL.

Figures 9A, 9B:
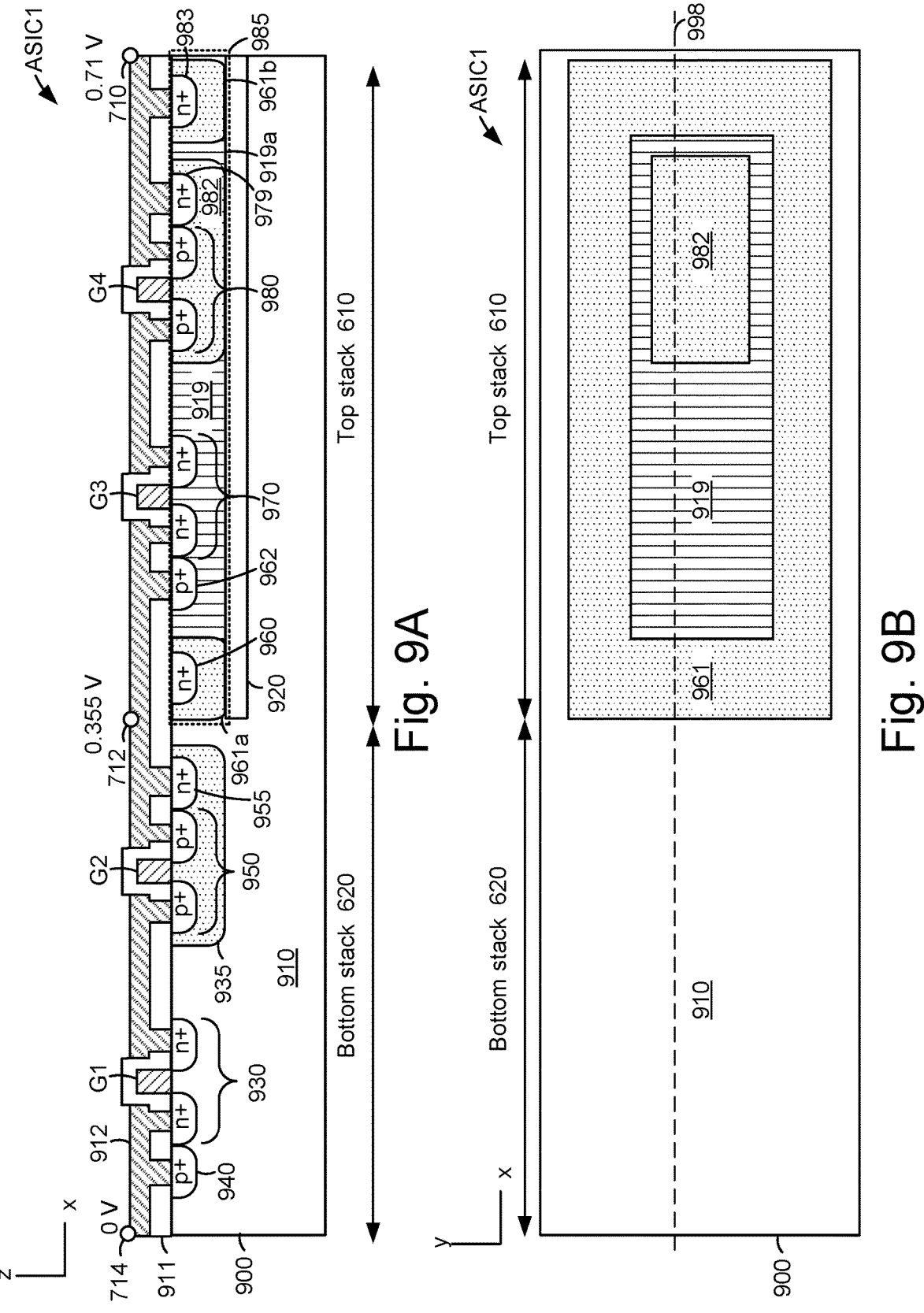
FIG. 9A depicts another example implementation of ASIC1 of FIG. 6, depicting a cross-sectional view of a substrate 900 which is shared by the top stack 610 and the bottom stack 620, in accordance with various embodiments.
FIG. 9B depicts a top view of the substrate 900 of FIG. 9A, in accordance with various embodiments.

FIG. 9A depicts another example implementation of ASIC1 of FIG. 6, depicting a cross-sectional view of a substrate 900 which is shared by the top stack 610 and the bottom stack 620, in accordance with various embodiments. The cross-sectional view is in an x-z plane, where z is the elevation or height and x is parallel to a plane of the substrate. As mentioned, a deep n-well region 920 can be provided in a substrate 900 to allow for different voltages domains within an IC. To create the n-well, n-type impurities are deposited in the p-type silicon substrate. The n-well is deep in that is it deposited at a depth in the substrate which is below a depth of n+ and p+ diffusion regions of the transistors fabricated on the substrate. The deep n-well is also below shallow n-wells in the substrate. In this example, the n-well region is in a bulk p-substrate region 910. The n-well region extends the length of the top stack 610, from the node 712 to the node 710 and forms an isolated region 985 which is isolated from the bulk p-substrate 910. The nodes 710, 712 and 714 of FIG. 7 are depicted.

The n-well region can be deposited while the portion of the substrate on which the bottom stack will be formed is masked. The mask is then removed. To form the transistors, in one possible implementation, a thin gate oxide layer is deposited on the substrate followed by a polysilicon layer. The polysilicon and the thin gate oxide are etched away except where the gates are to be formed. An oxidation layer is then deposited. A masking process is then performed to make openings in the oxidation layer when the n+ diffusion regions are to be deposited to create nMOS transistors and the oxide layer is removed. Subsequently, similar steps are performed to make openings in an oxidation layer where the p+ diffusion regions are to be deposited to create pMOS transistors. A thick field oxide is deposited and patterned to provide openings to the diffusion regions for the subsequent formation of metal connections.

A portion 911 of the patterned oxidation layer is depicted. A portion 912 of the field oxide is also depicted. The metal connections are not depicted here for simplicity.

A first set of processing engines such as those of the bottom stack 620 of the IC are formed on the bulk p-substrate 910. In the bottom stack 620, a p+ substrate tap 940 may be coupled to a ground voltage. An nMOS transistor 930 includes a gate G1 and adjacent n+ diffusion regions. A pMOS transistor 950 includes a gate G2 and adjacent p+ diffusion regions within a shallow n-well region 935. The shallow n-well region 935 is less deep in the substrate than the deep n-well region 920. An n+ well tap 955 is also formed within the n-well region 935.

A second set of processing engines such as those of the top stack 610 of the IC are formed on the isolated region 985 of the die. In the top stack 610, an n+ well tap 960 is formed within a shallow n-well 961*a*. A p+ substrate tap 962 is provided in an isolated p-substrate region 919 (isolated from the bulk p-substrate by the deep n-well region 920). An nMOS transistor 970 is formed within the p-substrate region 919. A pMOS transistor 980 is formed within a shallow n-well 982. An n+ well tap 979 is formed in the shallow n-well 982. An n+ well tap 983 is formed in an n-well 961*b* which is separated from the n-well 982 by a p-substrate region 919*a* which is connected to the p-substrate region 919 as depicted by FIG. 9B. The n-well regions 961*a* and 961*b* are connected as depicted in FIG. 9B.

In the isolated region 985, the diffusion regions of the transistors 970 and 980, denoted by n+ and p+, respectively, the taps 960, 962, 979 and 983, the shallow n-well regions 961*a*, 982 and 961*b* and the p-substrate region 919 are directly above the n-well region 920 and are isolated from the bulk p-substrate 910 by the n-well region 920.

In summary, an nMOS transistor 930 is formed on the bulk p-substrate 910, a pMOS transistor 950 is formed on a first shallow n-well region 935 of the die, where the first shallow n-well region of the die is in the bulk p-substrate, an nMOS transistor 970 is formed on a p-substrate region 919 which is isolated from the bulk p-substrate 910 of the die by the deep n-well region 920, and a pMOS transistor 980 is formed on a second shallow n-well region 982 of the die, where the second shallow n-well region of the die is isolated from the bulk p-substrate by the deep n-well region.

FIG. 9B depicts a top view of the substrate 900 of FIG. 9A, in accordance with various embodiments. The view is in the x-y plane, parallel to the plane of the substrate. The cross-sectional view of FIG. 9A is along the line 998. The n-well region 961, which includes the n-well regions 961*a* and 961*b* of FIG. 9A, is formed within the bulk p-substrate region 910. The p-substrate region 919 is formed within the n-well region 961, and the n-well region 982 is formed within the p-substrate region 920.

The configuration shown allows for two series-connected voltage domains in which the processing engines of an IC are located. Further, one voltage domain is implemented inside a deep n-well region of a substrate while the other voltage domain is implemented within a bulk p-substrate region of the substrate. This configuration provides voltage-stacking within an IC to reduce platform current by 50% and improve energy efficiency by 5%. The top half of the on-die voltage-stack is seated in a deep n-well region with custom level shifters to handle signal-traversal between the two voltage domains.

Some ICs, such as those used for cryptocurrency mining systems, are designed to operate at 355 mV with junction temperature of 75° C. to achieve an optimal trade-off between throughput and efficiency. This voltage drop is achieved for both the top and bottom stacks. To improve platform energy efficiency, a uniform activity profile of mining workloads across the engines can be maintained for a steady current flow and to minimize IR drop by voltage-stacking multiple cores or processing engines on the die on to maintain a balanced stack.

The deep N-well region is used to implement half of the digital logic to reduce noise coupling between the digital regions, which are on separate voltage domains. The internal distribution of the voltage domains on the die are implemented on a p-substrate and a deep n-well substrate.

Figure 10:
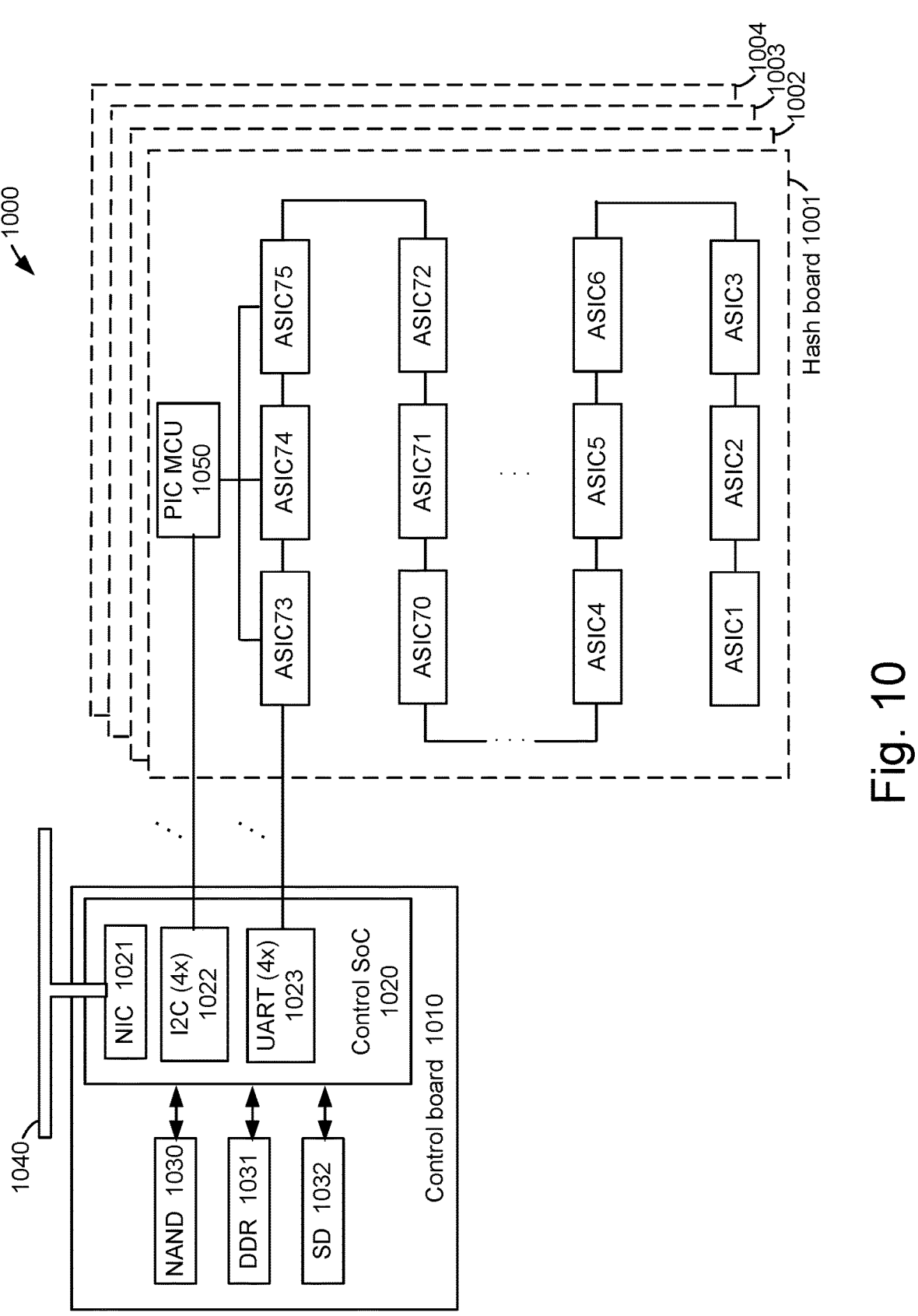
FIG. 10 depicts a computing device 1000 which includes a set of hash boards 1001-1004 and a control board 1010, in accordance with various embodiments.

FIG. 10 depicts a computing device 1000 which includes a set of hash boards 1001-1004 and a control board 1010, in accordance with various embodiments. As mentioned, identifying the ICs in a computing device is important to allow communications between a system controller and the ICs. One example implementation involves a high-performance cryptocurrency mining system which employs a large number of mining ASICs working in parallel on PoW algorithms. The system software is tasked with deploying workloads and monitoring the performance/efficiency of hundreds or thousands of ICs. This requires the software to uniquely identify each IC and maintain a database related to the jobs running, hash-rate, error rate and so forth. Conventional mining systems use programmable fuses implemented either on-die or on the hash board. However, on-die fuses are expensive in terms of silicon area and require additional programming steps during post-Si testing. Moreover, using static fuses on the hash board to externally program device ID increases BOM cost and platform design time. Further, they do not provide the flexibility of increasing the ID size for scaling up the mining systems.

To address this challenges, a solution is provided which uses Physically Unclonable Functions (PUFs) to generate unique device IDs to efficiently identify and configure ICs, such as in a large-scale mining system. PUFs are cryptographic primitives that leverage variations in the fabrication process to generate unique device-specific values on-die. These circuits use circuit characteristics such as power-up state, metastability, delay or switching threshold to amplify device variations.

In the example computing device, the 75 ASICs of FIG. 1 are repeated on each of the hash boards 1001-1004. The ASICs are arranged in rows of three. Each hash board communicates with a control board 1010 via a control system on a chip (SoC) 1020. Generally, a SoC is an integrated circuit that integrates components such as a central processing unit (CPU), memory, input/output ports and secondary storage, with other components such as radio modems. It may contain digital, analog, mixed-signal, and often radio frequency signal processing functions.

The control SoC includes a network interface card (NIC) for communicating with a network such as via an Ethernet path 1040. The control SoC further includes four Inter-Integrated Circuit (I2C) buses, one for communicating with a Programmable Interface Controller (PIC) microcontroller unit (MCU) on each of the hash boards. I2C refers to a synchronous, multi-controller/multi-target, packet switched, single-ended, serial communication bus used for attaching lower-speed peripheral ICs to processors and microcontrollers in short-distance, intra-board communications.

A PIC is an electronic circuit that can be programmed to carry out a range of tasks. An MCU is a small computer on a single metal-oxide-semiconductor (MOS) integrated circuit (IC) chip. An MCU contains one or more CPUs (processor cores) along with memory and programmable input/output peripherals. Program memory in the form of ferroelectric RAM, NOR flash or OTP ROM is also often included on chip, as well as a small amount of RAM. Microcontrollers are often designed for embedded applications. The PIC MCU can communicate with each ASIC or other IC on a board.

The control SoC further includes four Universal Asynchronous Receiver-Transmitters (UARTs), one for communicating with the ASICs on each of the hash boards. A UART is a computer hardware device for asynchronous serial communication in which the data format and transmission speeds are configurable. It sends data bits one by one, from the least significant to the most significant, framed by start and stop bits so that precise timing is handled by the communication channel. The electric signaling levels are handled by a driver circuit external to the UART. Two common signal levels are RS-232, a 12 V system, and RS-485, a 5 V system.

The control SoC communicates with a NAND memory device 1030, a DDR 1031 and an SD device 1032. NAND memory is a non-volatile memory which can be used to store the identifiers of the ICs, for example. DDR refers to Double Data Rate (DDR) Synchronous Dynamic Random Access Memory (SDRAM), which is a common type of memory used as RAM by modern processors. The SD device refers to a non-volatile memory card format for use in portable devices.

Figures 11, 12:
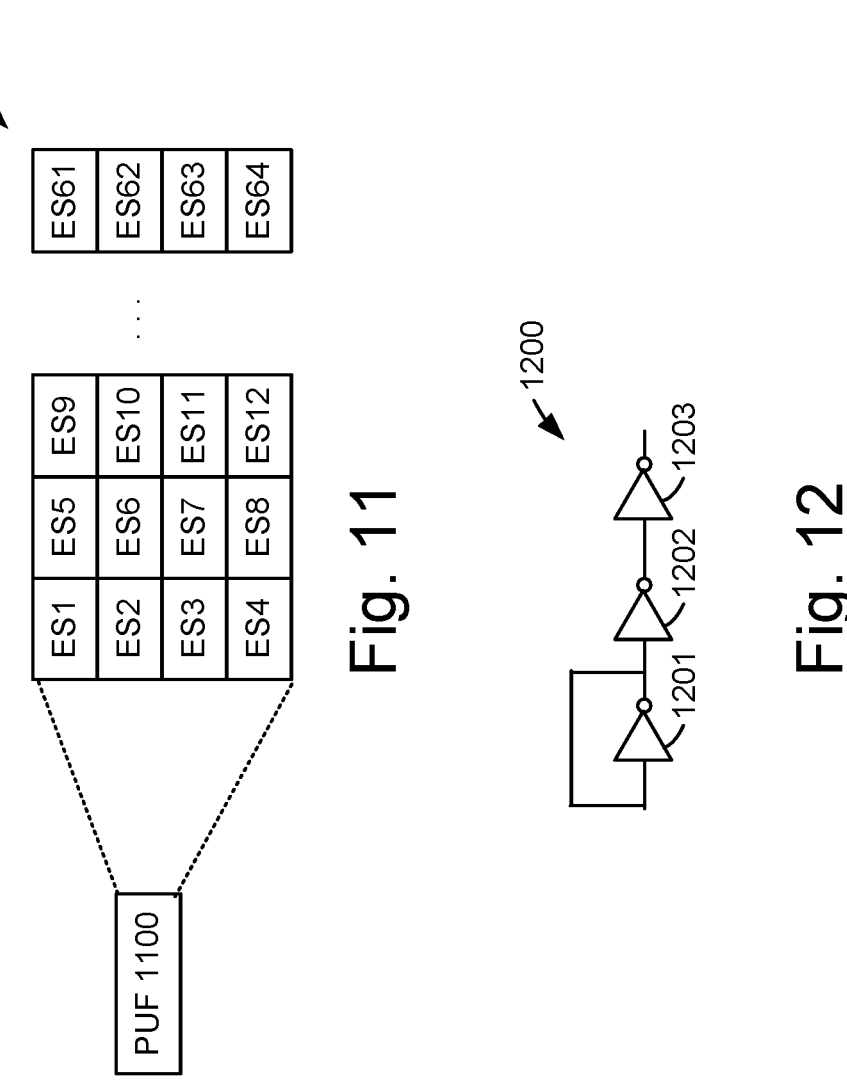
FIG. 11 depicts an example implementation of the physically unclonable function (PUF) 1100 in ASIC1 of FIGS. 2 and 10, as a set of entropy sources (ES) 1110, in accordance with various embodiments.
FIG. 12 depicts an example implementation of one of the entropy sources ES1-ES64 of FIG. 11 as a subthreshold amplifier, in accordance with various embodiments.
Figure 14:
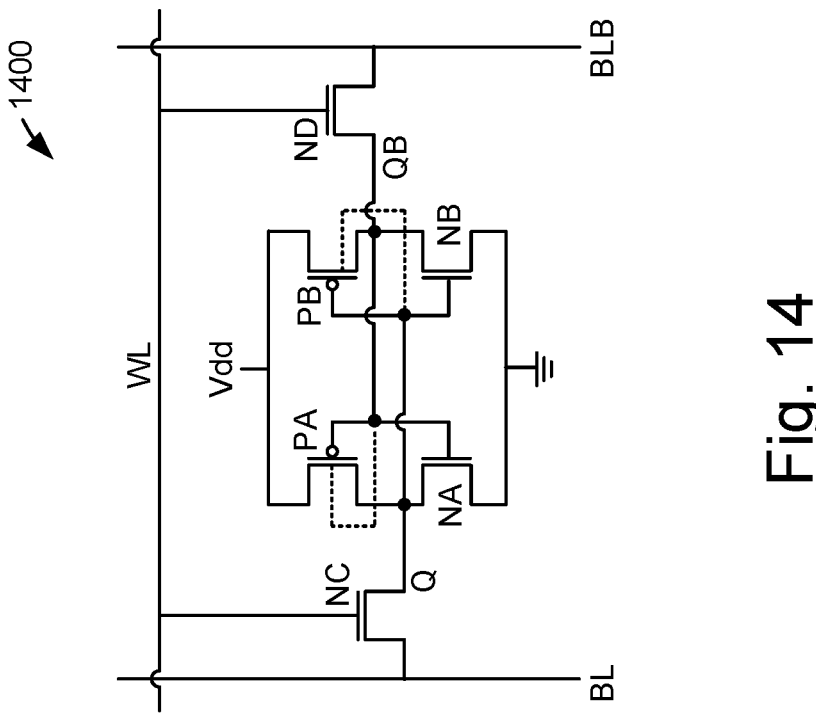
FIG. 14 depicts an example implementation of one of the entropy sources ES1-ES64 of FIG. 11 as a static random access memory (SRAM) bit cell, in accordance with various embodiments.
Figure 13:
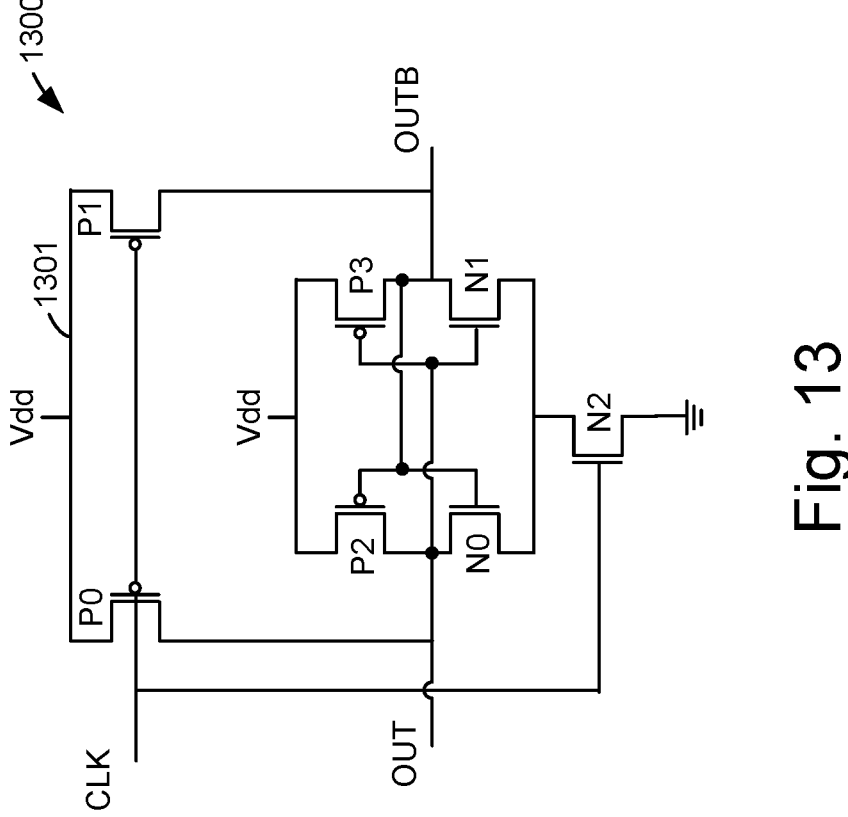
FIG. 13 depicts an example implementation of one of the entropy sources ES1-ES64 of FIG. 11 as a meta-stable cross-coupled inverter, in accordance with various embodiments.

FIG. 11 depicts an example implementation of the physically unclonable function (PUF) 1100 in ASIC1 of FIGS. 2 and 10, as a set of entropy sources (ES), in accordance with various embodiments. The PUF function can be used for ID generation, and includes an array of entropy sources (ESs), e.g., ES1-ES64. The ESs can be of one or more types, including a subthreshold amplifier, a clocked metastable circuit or an SRAM bit cell, such as depicted in FIG. 12-14, respectively. Other examples of PUF circuits include a delay based arbiter and variants of ring-oscillators. The number of ESs is dependent on the bit-error rate (BER) of the PUF ES and the number of unique IDs expected to be generated for a high volume ASIC manufacturing. For example, one ES may be provided for each bit of the identifier. 64 ESs may be provided to obtain a 64-bit identifier, for example.

To obtain an ID, each ES is issued a challenge and provides a response bit. The response bit generated from an ES depends on the magnitude of the local device variation. For instance, in the cross-coupled inverter circuit of FIG. 13, the resolution state of the cell, once the pre-charge is released, depends on the device mismatch in the cross-coupled inverters, as well as the clock pre-charge devices. If the net difference across the two halves of the circuit is not large enough, the response may not be a stable '1' or '0' across all operating voltages and temperature. This leads to bit-errors in the device ID. To compensate for temporal variations, stabilization techniques such as Temporal Majority Voting (TMV) and soft Dark Bit (DB) masking may be used. In TMV, the PUF ES is evaluated multiple times and the response which is given a majority of the time is selected as the ES response. This weeds out intermittent bit flips, resulting in a reduced bit error rate. During dark bit masking, PUF bits which are unstable across TMV operations are identified and forced to a pre-defined value of '0' or '1'. A dark-bit mask is generated upon each power-up to identify unstable bits/entropy sources and force them to the pre-defined value.

PUF-based device identification can be implemented in three modes depending on the area and cycle time available. A first mode is a baseline PUF-based identification. A second mode is a PUF-based identification with TMV. A third mode is a PUF-based identification with TMV and dark bit masking. See also FIG. 15A-15C for further details.

PUF-based device identification provides a number of advantages, in addition to avoiding the use of fuses. For example, since the PUF ID is generated on demand, the number of PUF bits can be provisioned to be larger than required. This will help in scaling the system as the number of ICs increases. For example, in a cryptocurrency mining system the scaling can range from a small mining box with a few hundred ASICs, to larger server-class systems with thousands of ASICs. The size of the ID can be configured seamlessly, without requiring any additional steps like in the case of programmable fuses. Further, the PUF IDs can be used during a binning process to bin or classify ASICs based on performance or energy-efficiency. Since the PUF values can be read out using traditional I/O such as UART/JTAG, there is no additional cost involved in ASIC identification. JTAG, or Joint Test Action Group, is an industry standard for verifying designs and testing printed circuit boards after manufacture. Binning can be used to identify the higher performing ASICs to sell them for a higher price, for example, or to otherwise select the most appropriate ASICs for a particular application.

FIG. 12 depicts an example implementation of one of the entropy sources ES1-ES64 of FIG. 11 as a subthreshold amplifier, in accordance with various embodiments. The subthreshold amplifier 1200 includes a first inverter 1201, a second inverter 1202 and a third inverter 1203, in a chain of inverters, where an output of the first inverter is shorted to the input of the first inverter. Since the input and output of the first inverter are shorted, its voltage is set to a switching point with high gain. Moreover, a mismatch between switching voltages of the successive inverters is amplified to full rail after a few stages.

FIG. 13 depicts an example implementation of one of the entropy sources ES1-ES64 of FIG. 11 as a meta-stable cross-coupled inverter, in accordance with various embodiments. A voltage Vdd is provided at a node 1301 of the entropy source circuit 1300. pMOS transistors P0 and P1 are provided in a conductive state when a clock signal CLK is low. The CLK signal pre-charges both OUT and OUTB to a value of 1 or Vdd when CLK is high. The pre-charge is then removed. The internal transistors including nMOS transistors N0 and N1, and pMOS transistors P2 and P3, form a cross coupled inverter, similar to a SRAM. When the pre-charge is removed, OUT and OUTB, which is the inverse of OUT, cannot both be 1 so that the circuit has to resolve to a stable state of 0 or 1, depending on the process variation in the device which is different in different ASICs. OUT is the output bit or response to a challenge.

FIG. 14 depicts an example implementation of one of the entropy sources ES1-ES64 of FIG. 11 as a static random access memory (SRAM) bit cell, in accordance with various embodiments. The memory cell is a six transistor (6T) SRAM cell 1400. PA and PB are pMOS transistors, and NA, NB, NC and ND are nMOS transistors. Each bit in the memory cell 1400 is stored in a storage cell comprising the four transistors PA, PB, NA and NB that form two cross-coupled inverters. The storage cell has two stable states which are used to store a logic 0 or 1. NC and ND are access transistors that control access to the memory cell during read and write operations. The access transistors are turned on whenever a word line (WL) is activated for read or write operation, connecting the storage cell to the complementary bit lines (BL and BLB). When the word line is not activated, the access transistors are turned off and the data is retained in the storage cell while power is applied to the memory cell.

The memory cell is a volatile memory that is, data in the memory cell is lost when power is not applied. When power is applied, due to inherent mismatches between the transistors PA, PB, NA and NB, the memory cell has an intrinsic bias toward a particular stable state (logic 0 or 1).

For an ideal, symmetric SRAM cell with no mismatch between the transistors, the internal data of the cell takes on a metastable state during system power up. However, an environmental noise source can push the cell toward one of its bi-stable states (logic 0 or 1). Any local mismatch between paired transistors (e.g., PA and NA, or PB and NB) skews the cell from its metastable starting point and provides an initial bias toward one of the bi-stable states.

For each of the pMOS transistors PA and PB, the reproducibility of the power-on stable state at power-up can be improved by connecting the body to the gate as indicated by the dotted lines, to create a forward body bias as the supply voltage is ramped-up.

A sense amplifier coupled to BL and BLB senses the signal on the bit lines to output an amplified signal that represents the state of the SRAM cell (logic 0 or 1).

FIG. 15A depicts a flowchart of an example process for generating an identifier for an IC, in accordance with various embodiments. Upon power-up, the IC will evaluate the PUF circuit to generate an ID. This ID is then read by the system software and stored in a database. For subsequent interactions between the IC and the system software, the IC will send its ID along with any communication, or the software will address each IC using the IC's unique ID.

Step 1500 involves an initial startup of a set of integrated circuits (ICs). Startup can refer to applying power to the ICs and boards, for example. At step 1501, each IC uses a physically unclonable function (PUF), also sometimes referred to as a physical unclonable function, to generate an identifier (ID) for the IC. For example, entropy sources can be used to generate respective bits, as discussed. At step 1502, each IC stores its identifier in a volatile memory, e.g., memory 214 in FIG. 2. At step 1503, a controller (e.g., controller 120 in FIGS. 1 and 2) reads the identifiers of the ICs from the volatile memories and updates a database (e.g., database 124 in FIG. 1) with the identifiers. At step 1504, the controller uses the identifiers to communicate with the ICs.

FIG. 15B depicts a flowchart of an example process for generating an identifier for an IC using a majority voting process and dark bit masking, in accordance with various embodiments. To improve the bit-error rate (BER) of the PUF generated ID, temporal majority voting can be employed. With TMV, each PUF ES is evaluated multiple times (an odd number of times, to avoid a tie vote) to obtain a plurality of candidate bits, for each bit position of the identifier. For each bit position, the response which is obtained the majority of the time is recorded as the PUF response bit. This helps in providing more consistent identifier and reducing the Hamming distance between the identifiers generated at different times. The margin for additional bits in the ID to account for the BER can also be reduced, effectively reducing the overall ID size.

Further, to supplement the BER improvement obtained with TMV, dark-bit masking can also be employed. In this technique, unstable bits are identified during the TMV process and forced to a pre-defined value of '0' or '1'. Since this process happens during the generation of the first ID after startup as well as during the generation of subsequent IDs, the unstable bits are always replaced with a stable static value. The unstable bits/entropy source can be identified by the PUF or the controller, for example.

In step 1510, for each bit position of an identifier, an IC uses a PUF to generate a plurality of candidate bits. At step 1511, for each bit position of the identifier, a controller reads the plurality of candidate bits and performs a majority voting process to select a bit value for the IC's identifier. For example, if a first bit of an ID is generated five times with the values 1, 0, 1, 0 and 1, the value 1 is selected since it appears three times while 0 appears only two times.

At step 1512, the controller identifies one or more unstable entropy sources and forces the corresponding bits to a predefined value. For example, assume five bit values are generated for each of 64 bit positions of an ID upon startup of an IC, and that the bit values are the same for 63 of the 64 bit positions. Each bit position corresponds to a respective entropy source which generates the bit values. However, the bit values are not all the same for one of the bit positions, for example, the tenth bit position. The corresponding entropy source, e.g., a tenth entropy source of out 64 entropy sources, is thus unstable. For example, see ES10 in FIG. 11. The bit position can therefore be masked or set as a dark bit by the controller by setting it to a predefined value such as 0. Upon a subsequent startup of the IC in which values are generated for each of the 64 bit positions, the controller can set the tenth bit position to 0 and ignore the bit values generated for this bit position by the respective entropy source. Generally, a bit position can be masked if there are more than a specified number of mismatched bits obtained for the bit position. For example, this could be one or two mismatched bits out of five. A mismatched bit of an entropy source is a bit whose value differs from the value of a majority of the bits of the entropy source, when the entropy source generates a plurality of bits values, e.g., for use in a majority voting process.

Generally, one or more of the integrated circuits comprise a plurality of entropy sources, and a controller is to identify one or more unstable entropy sources among the plurality of entropy sources and to mask bits of the one or more unstable entropy sources in the identifiers of the one or more integrated circuits. In one approach, to identify the one or more unstable entropy sources, the controller is to identify an entropy source generating one or more mismatched bits. In one approach, to identify the one or more unstable entropy sources, the controller is to identify an entropy source generating at least N mismatched bits out of M, where N and M are positive integers, $M > N$ and $N \geq 1$.

FIG. 15C depicts a flowchart of an example process for generating an identifier for an IC using a minimum Hamming distance, in accordance with various embodiments. Due to variations in operating voltage or temperature, the device ID generated by an IC on each power-up may not be identical. To overcome these bit errors, the system software can compute the Hamming distance, or other distance metric, between a current ID and previously-generated IDs. The previously-generated ID with the smallest Hamming distance can then accepted as a valid alternative ID for subsequent interactions between the controller and the IC. The number of bits in the PUF ID should be large enough to account for the number of devices to be identified, plus the expected bit-error rate.

At step 1520, an IC uses a PUF to generate an identifier upon startup of the IC. At step 1521, a controller reads and stores the identifier. A decision step 1522 determines whether the current identifier is a first identifier of the IC, e.g., whether there is no record of a previously-generated ID for the IC. If the decision step 1522 is true, the process returns to step 1520 to wait for the next startup of the IC. If the decision step 1522 is false, that is, there is a record of a previously-generated ID for the IC, step 1524 is reached. At this step, the controller generates a Hamming distance between the current identifier and the previous identifiers. The Hamming distance is a metric for comparing two binary data strings. While comparing two binary strings of equal length, Hamming distance is the number of bit positions in which the two bits are different. At step 1525, the controller selects one or more of the previous identifiers for which the Hamming distance is shortest as an alternative identifier for the IC.

A controller may exchange messages with the ICs using their identifiers. The controller can interpret a received message as being from a particular IC based on the message including any of one or more acceptable identifiers of the IC, including one or more alternative identifiers. Similarly, the controller can address a message to a particular IC using any of one or more acceptable identifiers of the IC in the message, including one or more alternative identifiers.

In one option, the controller selects a number of one or more previous identifiers for which the Hamming distance is shortest as alternative identifiers for the IC. The number of previous identifiers for which the Hamming distance is calculated can be all, or fewer than all, previous identifiers. In one approach, the controller calculates the Hamming distance between the current identifier and a predetermined number of previous-generated identifiers.

This approach allows one or more previous identifiers, as well as the current identifier, to be used to communicate with the IC.

Figure 16:
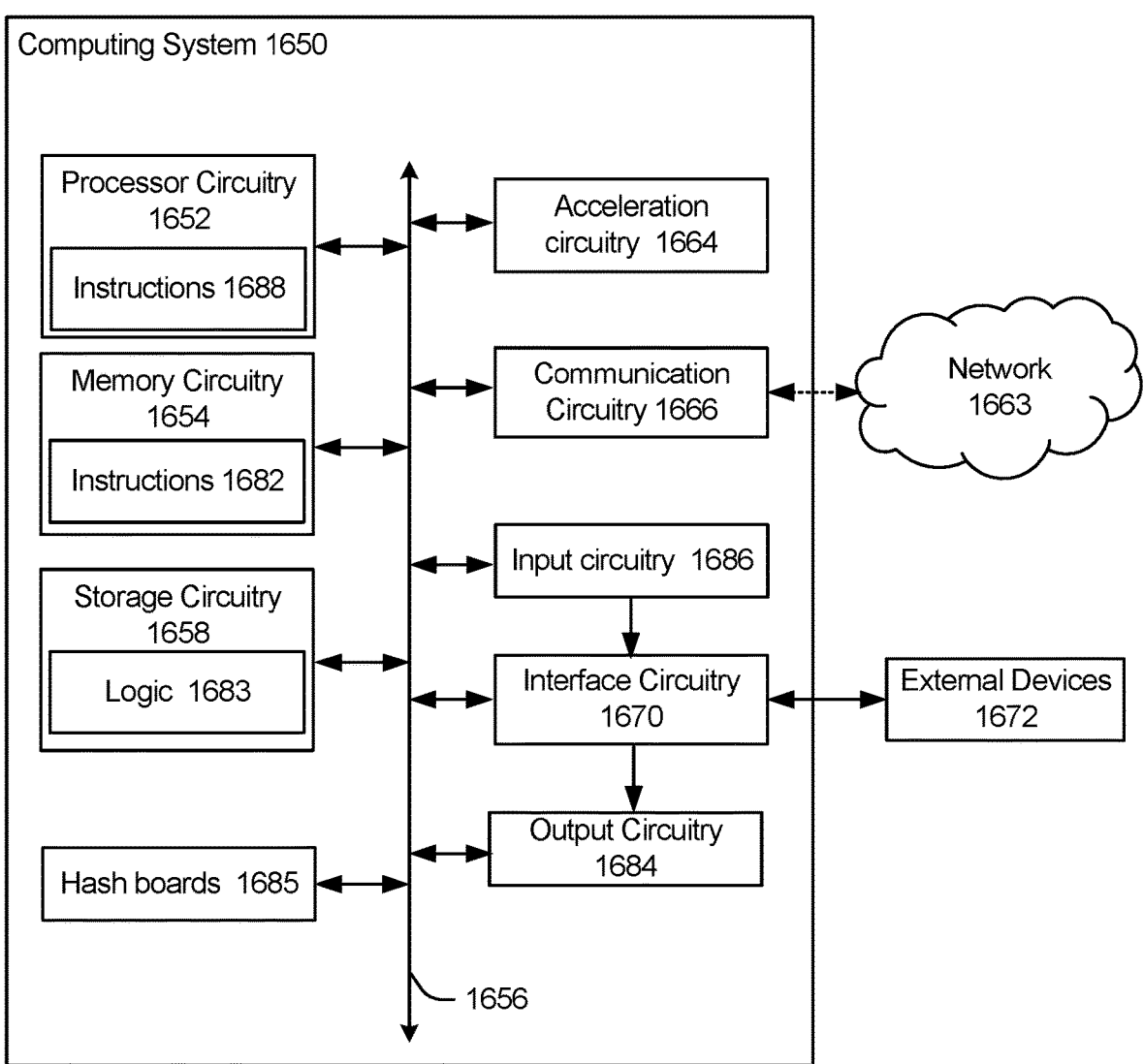
FIG. 16 illustrates an example of components that may be present in a computing system 1650 for implementing the techniques (e.g., operations, processes, methods, and methodologies) described herein.

FIG. 16 illustrates an example of components that may be present in a computing system 1650 for implementing the techniques (e.g., operations, processes, methods, and methodologies) described herein. The hash boards 1685 may corresponds to the board 110 of FIG. 1 or the hash boards 1001-1004 of FIG. 10. The boards include ICs which may be arranged as described herein. The processor circuitry 1652 may correspond to the controller 120 of FIG. 1 or to the control SoC 1020 of FIG. 10. The memory circuitry 1654 may correspond to the memory 122 of FIG. 1 or the DDR 1031 of FIG. 10. The storage circuitry 1658 may correspond to the database 124 of FIG. 1 or the NAND 1030 of FIG. 10.

The computing system 1650 may include any combinations of the hardware or logical components referenced herein. The components may be implemented as ICs, portions thereof, discrete electronic devices, or other modules, instruction sets, programmable logic or algorithms, hardware, hardware accelerators, software, firmware, or a combination thereof adapted in the computing system 1650, or as components otherwise incorporated within a chassis of a larger system. For one embodiment, at least one processor 1652 may be packaged together with computational logic 1682 and configured to practice aspects of various example embodiments described herein to form a System in Package (SiP) or a System on Chip (SoC).

The system 1650 includes processor circuitry in the form of one or more processors 1652. The processor circuitry 1652 includes circuitry such as, but not limited to one or more processor cores and one or more of cache memory, low drop-out voltage regulators (LDOs), interrupt controllers, serial interfaces such as SPI, I2C or universal programmable serial interface circuit, real time clock (RTC), timer-counters including interval and watchdog timers, general purpose I/O, memory card controllers such as secure digital/multi-media card (SD/MMC) or similar, interfaces, mobile industry processor interface (MIPI) interfaces and Joint Test Access Group (JTAG) test access ports. In some implementations, the processor circuitry 1652 may include one or more hardware accelerators (e.g., same or similar to acceleration circuitry 1664), which may be microprocessors, programmable processing devices (e.g., FPGA, ASIC, etc.), or the like. The one or more accelerators may include, for example, computer vision and/or deep learning accelerators. In some implementations, the processor circuitry 1652 may include on-chip memory circuitry, which may include any suitable volatile and/or non-volatile memory, such as DRAM, SRAM, EPROM, EEPROM, Flash memory, solid-state memory, and/or any other type of memory device technology, such as those discussed herein The processor circuitry 1652 may include, for example, one or more processor cores (CPUs), application processors, GPUs, RISC processors, Acorn RISC Machine (ARM) processors, CISC processors, one or more DSPs, one or more FPGAs, one or more PLDs, one or more ASICs, one or more baseband processors, one or more radio-frequency integrated circuits (RFIC), one or more microprocessors or controllers, a multi-core processor, a multithreaded processor, an ultra-low voltage processor, an embedded processor, or any other known processing elements, or any suitable combination thereof. The processors (or cores) 1652 may be coupled with or may include memory/storage and may be configured to execute instructions stored in the memory/storage to enable various applications or operating systems to run on the platform 1650. The processors (or cores) 1652 is configured to operate application software to provide a specific service to a user of the platform 1650. In some embodiments, the processor(s) 1652 may be a special-purpose processor(s)/controller(s) configured (or configurable) to operate according to the various embodiments herein.

As examples, the processor(s) 1652 may include an Intel® Architecture Core™ based processor such as an i3, an i5, an i7, an i9 based processor; an Intel® microcontroller-based processor such as a Quark™, an Atom™, or other MCU-based processor; Pentium® processor(s), Xeon® processor(s), or another such processor available from Intel® Corporation, Santa Clara, California. However, any number other processors may be used, such as one or more of Advanced Micro Devices (AMD) Zen® Architecture such as Ryzen® or EPYC® processor(s), Accelerated Processing Units (APUs), MxGPUs, Epyc® processor(s), or the like; A5-A12 and/or S1-S4 processor(s) from Apple® Inc., Snapdragon™ or Centrig™ processor(s) from Qualcomm® Technologies, Inc., Texas Instruments, Inc.® Open Multimedia Applications Platform (OMAP)™ processor(s); a MIPS-based design from MIPS Technologies, Inc. such as MIPS Warrior M-class, Warrior I-class, and Warrior P-class processors; an ARM-based design licensed from ARM Holdings, Ltd., such as the ARM Cortex-A, Cortex-R, and Cortex-M family of processors; the ThunderX2® provided by Cavium™, Inc.; or the like. In some implementations, the processor(s) 1652 may be a part of a system on a chip (SoC), System-in-Package (SiP), a multi-chip package (MCP), and/or the like, in which the processor(s) 1652 and other components are formed into a single integrated circuit, or a single package, such as the Edison™ or Galileo™ SoC boards from Intel® Corporation. Other examples of the processor(s) 1652 are mentioned elsewhere in the present disclosure.

The system 1650 may include or be coupled to acceleration circuitry 1664, which may be embodied by one or more AI/ML accelerators, a neural compute stick, neuromorphic hardware, an FPGA, an arrangement of GPUs, one or more SoCs (including programmable SoCs), one or more CPUs, one or more digital signal processors, dedicated ASICs (including programmable ASICs), PLDs such as complex (CPLDs) or high complexity PLDs (HCPLDs), and/or other forms of specialized processors or circuitry designed to accomplish one or more specialized tasks. These tasks may include AI/ML processing (e.g., including training, inferencing, and classification operations), visual data processing, network data processing, object detection, rule analysis, or the like. In FPGA-based implementations, the acceleration circuitry 1664 may comprise logic blocks or logic fabric and other interconnected resources that may be programmed (configured) to perform various functions, such as the procedures, methods, functions, etc. of the various embodiments discussed herein. In such implementations, the acceleration circuitry 1664 may also include memory cells (e.g., EPROM, EEPROM, flash memory, static memory (e.g., SRAM, anti-fuses, etc.) used to store logic blocks, logic fabric, data, etc. in LUTs and the like.

In some implementations, the processor circuitry 1652 and/or acceleration circuitry 1664 may include hardware elements specifically tailored for machine learning and/or artificial intelligence (AI) functionality. In these implementations, the processor circuitry 1652 and/or acceleration circuitry 1664 may be, or may include, an AI engine chip that can run many different kinds of AI instruction sets once loaded with the appropriate weightings and training code. Additionally or alternatively, the processor circuitry 1652 and/or acceleration circuitry 1664 may be, or may include, AI accelerator(s), which may be one or more of the aforementioned hardware accelerators designed for hardware acceleration of AI applications. As examples, these processor(s) or accelerators may be a cluster of artificial intelligence (AI) GPUs, tensor processing units (TPUs) developed by Google® Inc., Real AI Processors (RAPs™) provided by AlphaICs®, Nervana™ Neural Network Processors (NNPs) provided by Intel® Corp., Intel® Movidius™ Myriad™ X Vision Processing Unit (VPU), NVIDIA® PX™ based GPUs, the NM500 chip provided by General Vision®, Hardware 3 provided by Tesla®, Inc., an Epiphany™ based processor provided by Adapteva®, or the like. In some embodiments, the processor circuitry 1652 and/or acceleration circuitry 1664 and/or hardware accelerator circuitry may be implemented as AI accelerating co-processor(s), such as the Hexagon 685 DSP provided by Qualcomm®, the PowerVR 2NX Neural Net Accelerator (NNA) provided by Imagination Technologies Limited®, the Neural Engine core within the Apple® A11 or A12 Bionic SoC, the Neural Processing Unit (NPU) within the HiSilicon Kirin 970 provided by Huawei®, and/or the like. In some hardware-based implementations, individual subsystems of system 1650 may be operated by the respective AI accelerating co-processor(s), AI GPUs, TPUs, or hardware accelerators (e.g., FPGAs, ASICs, DSPs, SoCs, etc.), etc., that are configured with appropriate logic blocks, bit stream(s), etc. to perform their respective functions.

The system 1650 also includes system memory 1654. Any number of memory devices may be used to provide for a given amount of system memory. As examples, the memory 1654 may be, or include, volatile memory such as random access memory (RAM), static RAM (SRAM), dynamic RAM (DRAM), synchronous DRAM (SDRAM), RAM-BUS® Dynamic Random Access Memory (RDRAM®), and/or any other desired type of volatile memory device. Additionally or alternatively, the memory 1654 may be, or include, non-volatile memory such as read-only memory (ROM), erasable programmable ROM (EPROM), electrically erasable programmable (EEPROM), flash memory, non-volatile RAM, ferroelectric RAM, phase-change memory (PCM), flash memory, and/or any other desired type of non-volatile memory device. Access to the memory 1654 is controlled by a memory controller. The individual memory devices may be of any number of different package types such as single die package (SDP), dual die package (DDP) or quad die package (Q17P). Any number of other memory implementations may be used, such as dual inline memory modules (DIMMs) of different varieties including but not limited to microDIMMs or MiniDIMMs.

Storage circuitry 1658 provides persistent storage of information such as data, applications, operating systems and so forth. In an example, the storage 1658 may be implemented via a solid-state disk drive (SSDD) and/or high-speed electrically erasable memory (commonly referred to as "flash memory"). Other devices that may be used for the storage 1658 include flash memory cards, such as SD cards, microSD cards, XD picture cards, and the like, and USB flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, phase change RAM (PRAM), resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a Domain Wall (DW) and Spin Orbit Transfer (SOT) based device, a thyristor based memory device, a hard disk drive (HDD), micro HDD, of a combination thereof, and/or any other memory. The memory circuitry 1654 and/or storage circuitry 1658 may also incorporate three-dimensional (3D) cross-point (XPOINT) memories from Intel® and Micron®.

The memory circuitry 1654 and/or storage circuitry 1658 is/are configured to store computational logic 1683 in the form of software, firmware, microcode, or hardware-level instructions to implement the techniques described herein. The computational logic 1683 may be employed to store working copies and/or permanent copies of programming instructions, or data to create the programming instructions, for the operation of various components of system 1650 (e.g., drivers, libraries, application programming interfaces (APIs), etc.), an operating system of system 1650, one or more applications, and/or for carrying out the embodiments discussed herein. The computational logic 1683 may be stored or loaded into memory circuitry 1654 as instructions 1682, or data to create the instructions 1682, which are then accessed for execution by the processor circuitry 1652 to carry out the functions described herein. The processor circuitry 1652 and/or the acceleration circuitry 1664 accesses the memory circuitry 1654 and/or the storage circuitry 1658 over the interconnect (IX) 1656. The instructions 1682 direct the processor circuitry 1652 to perform a specific sequence or flow of actions, for example, as described with respect to flowchart(s) and block diagram(s) of operations and functionality depicted previously. The various elements may be implemented by assembler instructions supported by processor circuitry 1652 or high-level languages that may be compiled into instructions 1688, or data to create the instructions 1688, to be executed by the processor circuitry 1652. The permanent copy of the programming instructions may be placed into persistent storage devices of storage circuitry 1658 in the factory or in the field through, for example, a distribution medium (not shown), through a communication interface (e.g., from a distribution server (not shown)), over-the-air (OTA), or any combination thereof.

The IX 1656 couples the processor 1652 to communication circuitry 1666 for communications with other devices, such as a remote server (not shown) and the like. The communication circuitry 1666 is a hardware element, or collection of hardware elements, used to communicate over one or more networks 1663 and/or with other devices. In one example, communication circuitry 1666 is, or includes, transceiver circuitry configured to enable wireless communications using any number of frequencies and protocols such as, for example, the Institute of Electrical and Electronics Engineers (IEEE) 802.11 (and/or variants thereof), IEEE 802.23.4, Bluetooth® and/or Bluetooth® low energy (BLE), ZigBee®, LoRaWAN™ (Long Range Wide Area Network), a cellular protocol such as 3GPP LTE and/or Fifth Generation (5G)/New Radio (NR), and/or the like. Additionally or alternatively, communication circuitry 1666 is, or includes, one or more network interface controllers (NICs) to enable wired communication using, for example, an Ethernet connection, Controller Area Network (CAN), Local Interconnect Network (LIN), DeviceNet, ControlNet, Data Highway+, or PROFINET, among many others.

The IX 1656 also couples the processor 1652 to interface circuitry 1670 that is used to connect system 1650 with one or more external devices 1672. The external devices 1672 may include, for example, sensors, actuators, positioning circuitry (e.g., global navigation satellite system (GNSS)/Global Positioning System (GPS) circuitry), client devices, servers, network appliances (e.g., switches, hubs, routers, etc.), integrated photonics devices (e.g., optical neural network (ONN) integrated circuit (IC) and/or the like), and/or other like devices.

In some optional examples, various input/output (I/O) devices may be present within or connected to, the system 1650, which are referred to as input circuitry 1686 and output circuitry 1684 in FIG. 16. The input circuitry 1686 and output circuitry 1684 include one or more user interfaces designed to enable user interaction with the platform 1650 and/or peripheral component interfaces designed to enable peripheral component interaction with the platform 1650. Input circuitry 1686 may include any physical or virtual means for accepting an input including, inter alia, one or more physical or virtual buttons (e.g., a reset button), a physical keyboard, keypad, mouse, touchpad, touchscreen, microphones, scanner, headset, and/or the like. The output circuitry 1684 may be included to show information or otherwise convey information, such as sensor readings, actuator position(s), or other like information. Data and/or graphics may be displayed on one or more user interface components of the output circuitry 1684. Output circuitry 1684 may include any number and/or combinations of audio or visual display, including, inter alia, one or more simple visual outputs/indicators (e.g., binary status indicators (e.g., light emitting diodes (LEDs)) and multi-character visual outputs, or more complex outputs such as display devices or touchscreens (e.g., Liquid Crystal Displays (LCD), LED displays, quantum dot displays, projectors, etc.), with the output of characters, graphics, multimedia objects, and the like being generated or produced from the operation of the platform 1650. The output circuitry 1684 may also include speakers and/or other audio emitting devices, printer(s), and/or the like. Additionally or alternatively, sensor(s) may be used as the input circuitry 1684 (e.g., an image capture device, motion capture device, or the like) and one or more actuators may be used as the output device circuitry 1684 (e.g., an actuator to provide haptic feedback or the like). Peripheral component interfaces may include, but are not limited to, a non-volatile memory port, a USB port, an audio jack, a power supply interface, etc. In some embodiments, a display or console hardware, in the context of the present system, may be used to provide output and receive input of an edge computing system; to manage components or services of an edge computing system; identify a state of an edge computing component or service; or to conduct any other number of management or administration functions or service use cases.

The components of the system 1650 may communicate over the IX 1656. The IX 1656 may include any number of technologies, including ISA, extended ISA, I2C, SPI, point-to-point interfaces, power management bus (PMBus), PCI, PCIe, PCIx, Intel® UPI, Intel® Accelerator Link, Intel® CXL, CAPI, OpenCAPI, Intel® QPI, UPI, Intel® OPA IX, RapidIO™ system IXs, CCIX, Gen-Z Consortium IXs, a HyperTransport interconnect, NVLink provided by NVIDIA®, a Time-Trigger Protocol (TTP) system, a FlexRay system, PROFIBUS, and/or any number of other IX technologies. The IX 1656 may be a proprietary bus, for example, used in a SoC based system.

The number, capability, and/or capacity of the elements of system 1650 may vary, depending on whether computing system 1650 is used as a stationary computing device (e.g., a server computer in a data center, a workstation, a desktop computer, etc.) or a mobile computing device (e.g., a smartphone, tablet computing device, laptop computer, game console, IoT device, etc.). In various implementations, the computing device system 1650 may comprise one or more components of a data center, a desktop computer, a workstation, a laptop, a smartphone, a tablet, a digital camera, a smart appliance, a smart home hub, a network appliance, and/or any other device/system that processes data.

The techniques described herein can be performed partially or wholly by software or other instructions provided in a machine-readable storage medium (e.g., memory). The software is stored as processor-executable instructions (e.g., instructions to implement any other processes discussed herein). Instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions.

The storage medium can be a tangible machine readable medium such as read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs)), among others.

The storage medium may be included, e.g., in a communication device, a computing device, a network device, a personal digital assistant, a manufacturing tool, a mobile communication device, a cellular phone, a notebook computer, a tablet, a game console, a set top box, an embedded system, a TV (television), or a personal desktop computer.

Some non-limiting examples of various embodiments are presented below.

Example 1 includes an apparatus, comprising: a plurality of die in a voltage-stacked configuration; and on each die, a tunable replica circuit comprising a tunable delay circuit, the tunable replica circuit is to determine a delay of the tunable delay circuit and to provide a first control signal based on the delay, and a phase-locked loop (PLL) to output a clock signal to a plurality of processing engines on the die, wherein when the first control signal is provided to the PLL, the PLL is responsive to the first control signal to adjust a frequency of the clock signal to regulate a voltage drop of the die.

Example 2 includes the apparatus of Example 1, wherein for one or more of the die, the delay of the tunable delay is set as a product of a predetermined multiplier and a critical path of a plurality of integrated circuits on the die.

Example 3 includes the apparatus of Example 1 or 2, wherein for one or more of the die, the tunable delay circuit comprises a chain of tunable inverters.

Example 4 includes the apparatus of any one of Examples 1-3, wherein for one or more of the die, the tunable delay circuit comprises a digitally programmable delay generator.

Example 5 includes the apparatus of any one of Examples 1-4, wherein for one or more of the die, the tunable delay circuit comprises a tunable data path mimicking a critical path of a plurality of integrated circuits on the die, and the tunable data path comprise a plurality of carry-save adders.

Example 6 includes the apparatus of any one of Examples 1-5, wherein for one or more of the die, the tunable delay circuit comprises a data path mimicking a critical path of a plurality of integrated circuits on the die with a tunable launch/capture clock.

Example 7 includes the apparatus of any one of Examples 1-6, wherein the first control signal is to instruct the PLL to increase a frequency of the clock signal if the delay exceeds an upper threshold.

Example 8 includes the apparatus of any one of Examples 1-7, wherein the first control signal is to instruct the PLL to decrease a frequency of the clock signal if the delay falls below a lower threshold.

Example 9 includes the apparatus of any one of Examples 1-8, wherein for each die, the plurality of processing engines are to work in parallel on computations of a cryptographic hashing algorithm.

Example 10 includes the apparatus of any one of Examples 1-9, wherein the plurality of die are arranged in rows, each row comprising multiple die; the rows are in a voltage-stacked configuration; and the PLL is responsive to the first control signal to adjust the frequency of the clock signal to regulate a voltage drop of each row.

Example 11 includes the apparatus of any one of Examples 1-10, wherein for one or more of the die, a sense circuit to monitor a voltage drop of the die, wherein a controller is to query the sense circuits of the one or more of the die to obtain the voltage drop and to provide a second control signal based on the voltage drop, wherein when the second control signal is provided to the PLL, and the PLL is responsive to the second control signal in place of the first control signal to adjust the frequency of the clock signal to regulate the voltage drop of the die.

Example 12 includes the apparatus of Example 11, wherein for the one or more of the die, the second control signal is to replace the first control signal when the voltage drop of the one or more of the die is beyond at least one of a lower threshold or an upper threshold.

Example 13 includes the apparatus of any one of Examples 1-12, wherein the PLLs of the plurality of die are to adjust the frequencies of the clock signals to equalize a voltage drop of each die.

Example 14 includes an apparatus, comprising: a plurality of die in a voltage-stacked configuration; and on each die, a first set of processing engines arranged on a bulk p-substrate of the die and a second set of processing engines arranged on an isolated region of the die, wherein the isolated region of the die is isolated from the bulk p-substrate by a deep n-well region of the die, the first set of processing engines is in a respective voltage domain on the bulk p-substrate and the second set of processing engines is in a respective voltage domain on the isolated region, in a voltage-stacked configuration.

Example 15 includes the apparatus of Example 14, wherein: on each die, the isolated region of the die comprises a p-substrate region surrounding a shallow n-well region; and a shallow n-well region surrounding the p-substrate region.

Example 16 includes the apparatus of Example 14 or 15, wherein on each die: an nMOS transistor is formed on the bulk p-substrate; a pMOS transistor is formed on a first shallow n-well region of the die, the first shallow n-well region of the die is in the bulk p-substrate; an nMOS transistor is formed on a p-substrate region of the isolated region; and a pMOS transistor is formed on a second shallow n-well region of the isolated region.

Example 17 includes the apparatus of any one of Examples 14-16, wherein on each die: the first set of processing engines has a supply voltage and a source voltage; the second set of processing engines has a supply voltage and a source voltage; the supply voltage of the second set of processing engines is equal to the source voltage of the first set of processing engines; and the supply voltage of the first set of processing engines is greater than the supply voltage of the second set of processing engines.

Example 18 includes the apparatus of any one of Examples 14-17, further comprising on each die, a low-to-high level shifter to provide a voltage to the second set of processing engines and a high-to-low level shifter to provide a voltage to the first set of processing engines.

Example 19 includes the apparatus of any one of Examples 14-18, further comprising: on each die, a first phase-locked loop (PLL) to provide a clock signal to the first set of processing engines and a second PLL to provide a clock signal to the second set of processing engines.

Example 20 includes an apparatus, comprising: a plurality of integrated circuits on one or more hash boards, wherein upon startup of each integrated circuit, each integrated circuit is to use a physically unclonable function (PUF) to generate an identifier of the integrated circuit; and a controller coupled to the plurality of integrated circuits, wherein the controller is to read the identifier of each integrated circuit and update a database with the identifiers.

Example 21 includes the apparatus of Example 20, wherein: for one or more of the integrated circuits, the controller is to determine a Hamming distance between the identifier and a plurality of previously-generated identifiers of the one or more of the integrated circuits, and to set one or more of the plurality of previously-generated identifiers for which the Hamming distance is shortest as alternative identifiers of the one or more of the integrated circuits.

Example 22 includes the apparatus of Example 20 or 21, wherein: upon startup of one or more of the integrated circuits, the one or more of the integrated circuits are to use the PUF to generate a plurality of candidate bits for one or more bit positions of an identifier; and the controller is to read the plurality of candidate bits for the one or more bit positions and perform a majority voting process on the plurality of candidate bits to select a bit value for the one or more bit positions.

Example 23 includes the apparatus of any one of Examples 20-22, wherein: one or more of the integrated circuits comprise a plurality of entropy sources; and the controller is to identify one or more unstable entropy sources among the plurality of entropy sources and to mask bits of the one or more unstable entropy sources in the identifiers of the one or more integrated circuits.

Example 24 includes the apparatus of Example 23, wherein: to identify the one or more unstable entropy sources, the controller is to identify an entropy source generating one or more mismatched bits.

Example 25 includes the apparatus of Example 23 or 24, wherein: to identify the one or more unstable entropy sources, the controller is to identify an entropy source generating at least N mismatched bits out of M bits, where N and M are positive integers, M>N and N≥1.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:

a plurality of die in a voltage-stacked configuration; and on each die, a tunable replica circuit comprising a tunable delay circuit, the tunable replica circuit is to determine a delay of the tunable delay circuit and to provide a first control signal based on the delay, and a phase-locked loop (PLL) to output a clock signal with a target frequency to a plurality of processing engines on the die, wherein when the first control signal is provided to the PLL, the PLL is responsive to the first control signal to adjust the target frequency of the clock signal to regulate a voltage drop of the die.

2. The apparatus of claim 1, wherein:
for one or more of the die, the delay of the tunable delay is set as a product of a predetermined multiplier and a critical path of a plurality of integrated circuits on the die.

3. The apparatus of claim 1, wherein:
for one or more of the die, the tunable delay circuit comprises a chain of tunable inverters.

4. The apparatus of claim 1, wherein:
for one or more of the die, the tunable delay circuit comprises a digitally programmable delay generator.

5. The apparatus of claim 1, wherein:
for one or more of the die, the tunable delay circuit comprises a tunable data path mimicking a critical path of a plurality of integrated circuits on the die, and the tunable data path comprise a plurality of carry-save adders.

6. The apparatus of claim 1, wherein:
for one or more of the die, the tunable delay circuit comprises a data path mimicking a critical path of a plurality of integrated circuits on the die with a tunable launch/capture clock.

7. The apparatus of claim 1, wherein:
the first control signal is to instruct the PLL to increase the target frequency of the clock signal if the delay exceeds an upper threshold.

8. The apparatus of claim 1, wherein:
the first control signal is to instruct the PLL to decrease the target frequency of the clock signal if the delay falls below a lower threshold.

9. The apparatus of claim 1, wherein:
for each die, the plurality of processing engines are to work in parallel on computations of a cryptographic hashing algorithm.

10. The apparatus of claim 1, wherein:
the plurality of die are arranged in rows, each row comprising multiple die;
the rows are in a voltage-stacked configuration; and
the PLL is responsive to the first control signal to adjust the target frequency of the clock signal to regulate a voltage drop of each row.

11. The apparatus of claim 1, further comprising:
for one or more of the die, a sense circuit to monitor a voltage drop of the die, wherein a controller is to query the sense circuits of the one or more of the die to obtain the voltage drop and to provide a second control signal based on the voltage drop, wherein when the second control signal is provided to the PLL, and the PLL is responsive to the second control signal in place of the first control signal to adjust the target frequency of the clock signal to regulate the voltage drop of the die.

12. The apparatus of claim 11, wherein:
for the one or more of the die, the second control signal is to replace the first control signal when the voltage drop of the one or more of the die is beyond at least one of a lower threshold or an upper threshold.

13. The apparatus of claim 1, wherein:
the PLLs of the plurality of die are to adjust the frequencies of the clock signals to equalize a voltage drop of each die.

* * * * *